(12) United States Patent
Tsuji et al.

(10) Patent No.: US 8,372,664 B2
(45) Date of Patent: Feb. 12, 2013

(54) METHOD FOR MANUFACTURING DISPLAY DEVICE

(75) Inventors: Takahiro Tsuji, Okayama (JP); Koji Moriya, Atsugi (JP)

(73) Assignee: Semiconductor Energy Laboratory Co., Ltd., Atsugi-shi, Kanagawa-ken (JP)

(*) Notice: Subject to any disclaimer, the term of this patent is extended or adjusted under 35 U.S.C. 154(b) by 0 days.

(21) Appl. No.: 12/974,263

(22) Filed: Dec. 21, 2010

(65) Prior Publication Data

US 2011/0159619 A1 Jun. 30, 2011

(30) Foreign Application Priority Data

Dec. 25, 2009 (JP) ................................ 2009-296066

(51) Int. Cl.
*H01L 27/12* (2006.01)
*H01L 21/66* (2006.01)

(52) U.S. Cl. ............. 438/4; 438/26; 438/30; 438/149; 438/126; 438/127; 257/432; 257/433; 257/435; 257/440

(58) Field of Classification Search .............. 438/22, 438/26, 29, 30, 38, 455, 458, 689, 690, 798, 438/800, 126, 127, 149, 151, 795, FOR. 407, 438/FOR. 410, FOR. 415, FOR. 416, FOR. 417; 257/E21.328, E21.333, E21.411; 349/187, 349/189, 190, 192

See application file for complete search history.

(56) References Cited

U.S. PATENT DOCUMENTS

| | | |
|---|---|---|
| 5,731,856 A | 3/1998 | Kim et al. |
| 5,744,864 A | 4/1998 | Cillessen et al. |
| 6,163,357 A * | 12/2000 | Nakamura .................... 349/155 |
| 6,294,274 B1 | 9/2001 | Kawazoe et al. |
| 6,326,225 B1 * | 12/2001 | Yamazaki et al. ............. 438/30 |
| 6,563,174 B2 | 5/2003 | Kawasaki et al. |
| 6,727,522 B1 | 4/2004 | Kawasaki et al. |
| 7,049,190 B2 | 5/2006 | Takeda et al. |
| 7,061,014 B2 | 6/2006 | Hosono et al. |

(Continued)

FOREIGN PATENT DOCUMENTS

| | | |
|---|---|---|
| EP | 1737044 A | 12/2006 |
| EP | 2226847 A | 9/2010 |

(Continued)

OTHER PUBLICATIONS

Shin.J et al., "Light Effects on the Bias Stability of Transparent ZnO Thin Film Transistors,", ETRI Journal, Feb. 1, 2009, vol. 31, No. 1, pp. 62-64.

(Continued)

*Primary Examiner* — Olik Chaudhuri
*Assistant Examiner* — Quovaunda V Jefferson
(74) *Attorney, Agent, or Firm* — Eric J. Robinson; Robinson Intellectual Property Law Office, P.C.

(57) ABSTRACT

One object is to provide a method for manufacturing a display device in which shift of the threshold voltage of a thin film transistor including an oxide semiconductor layer can be suppressed even when ultraviolet light irradiation is performed in the process for manufacturing the display device. In the method for manufacturing a display device, ultraviolet light irradiation is performed at least once, a thin film transistor including an oxide semiconductor layer is used for a switching element, and heat treatment for repairing damage to the oxide semiconductor layer caused by the ultraviolet light irradiation is performed after all the steps of ultraviolet light irradiation are completed.

30 Claims, 11 Drawing Sheets

U.S. PATENT DOCUMENTS

| | | | |
|---|---|---|---|
| 7,064,346 B2 | 6/2006 | Kawasaki et al. | |
| 7,105,868 B2 | 9/2006 | Nause et al. | |
| 7,211,825 B2 | 5/2007 | Shih et al. | |
| 7,282,782 B2 | 10/2007 | Hoffman et al. | |
| 7,297,977 B2 | 11/2007 | Hoffman et al. | |
| 7,323,356 B2 | 1/2008 | Hosono et al. | |
| 7,327,433 B2 | 2/2008 | Miyachi et al. | |
| 7,342,632 B2 | 3/2008 | Miyachi et al. | |
| 7,385,224 B2 | 6/2008 | Ishii et al. | |
| 7,387,858 B2 | 6/2008 | Chari et al. | |
| 7,402,506 B2 | 7/2008 | Levy et al. | |
| 7,411,209 B2 | 8/2008 | Endo et al. | |
| 7,453,065 B2 | 11/2008 | Saito et al. | |
| 7,453,087 B2 | 11/2008 | Iwasaki | |
| 7,462,862 B2 | 12/2008 | Hoffman et al. | |
| 7,468,304 B2 | 12/2008 | Kaji et al. | |
| 7,501,293 B2 | 3/2009 | Ito et al. | |
| 7,576,829 B2 | 8/2009 | Kikuchi et al. | |
| 7,674,650 B2 | 3/2010 | Akimoto et al. | |
| 7,732,819 B2 | 6/2010 | Akimoto et al. | |
| 7,915,823 B2 | 3/2011 | Hayashi | |
| 2001/0046027 A1 | 11/2001 | Tai et al. | |
| 2001/0055841 A1* | 12/2001 | Yamazaki et al. | 438/151 |
| 2002/0056838 A1 | 5/2002 | Ogawa | |
| 2002/0132454 A1 | 9/2002 | Ohtsu et al. | |
| 2003/0184704 A1* | 10/2003 | Akiyama et al. | 349/158 |
| 2003/0189401 A1 | 10/2003 | Kido et al. | |
| 2003/0218222 A1 | 11/2003 | Wager et al. | |
| 2004/0038446 A1 | 2/2004 | Takeda et al. | |
| 2004/0127038 A1 | 7/2004 | Carcia et al. | |
| 2005/0017302 A1 | 1/2005 | Hoffman | |
| 2005/0199959 A1 | 9/2005 | Chiang et al. | |
| 2006/0035452 A1 | 2/2006 | Carcia et al. | |
| 2006/0043377 A1 | 3/2006 | Hoffman et al. | |
| 2006/0091793 A1 | 5/2006 | Baude et al. | |
| 2006/0108529 A1 | 5/2006 | Saito et al. | |
| 2006/0108636 A1 | 5/2006 | Sano et al. | |
| 2006/0110867 A1 | 5/2006 | Yabuta et al. | |
| 2006/0113536 A1 | 6/2006 | Kumomi et al. | |
| 2006/0113539 A1 | 6/2006 | Sano et al. | |
| 2006/0113549 A1 | 6/2006 | Den et al. | |
| 2006/0113565 A1 | 6/2006 | Abe et al. | |
| 2006/0169973 A1 | 8/2006 | Isa et al. | |
| 2006/0170111 A1 | 8/2006 | Isa et al. | |
| 2006/0197092 A1 | 9/2006 | Hoffman et al. | |
| 2006/0203169 A1 | 9/2006 | Ozawa et al. | |
| 2006/0208977 A1 | 9/2006 | Kimura | |
| 2006/0227283 A1 | 10/2006 | Ooi et al. | |
| 2006/0228974 A1 | 10/2006 | Thelss et al. | |
| 2006/0231882 A1 | 10/2006 | Kim et al. | |
| 2006/0238135 A1 | 10/2006 | Kimura | |
| 2006/0244107 A1 | 11/2006 | Sugihara et al. | |
| 2006/0284171 A1 | 12/2006 | Levy et al. | |
| 2006/0284172 A1 | 12/2006 | Ishii | |
| 2006/0292726 A1* | 12/2006 | Akimoto et al. | 438/30 |
| 2006/0292777 A1 | 12/2006 | Dunbar | |
| 2007/0024187 A1 | 2/2007 | Shin et al. | |
| 2007/0046191 A1 | 3/2007 | Saito | |
| 2007/0052025 A1 | 3/2007 | Yabuta | |
| 2007/0054507 A1 | 3/2007 | Kaji et al. | |
| 2007/0090365 A1 | 4/2007 | Hayashi et al. | |
| 2007/0108446 A1 | 5/2007 | Akimoto | |
| 2007/0152217 A1 | 7/2007 | Lai et al. | |
| 2007/0172591 A1 | 7/2007 | Seo et al. | |
| 2007/0187678 A1 | 8/2007 | Hirao et al. | |
| 2007/0187760 A1 | 8/2007 | Furuta et al. | |
| 2007/0194379 A1 | 8/2007 | Hosono et al. | |
| 2007/0252928 A1 | 11/2007 | Ito et al. | |
| 2007/0267633 A1* | 11/2007 | Park et al. | 257/59 |
| 2007/0272922 A1 | 11/2007 | Kim et al. | |
| 2007/0287296 A1 | 12/2007 | Chang | |
| 2008/0006877 A1 | 1/2008 | Mardilovich et al. | |
| 2008/0038882 A1 | 2/2008 | Takechi et al. | |
| 2008/0038929 A1 | 2/2008 | Chang | |
| 2008/0050595 A1 | 2/2008 | Nakagawara et al. | |
| 2008/0073653 A1 | 3/2008 | Iwasaki | |
| 2008/0083950 A1 | 4/2008 | Pan et al. | |
| 2008/0106191 A1 | 5/2008 | Kawase | |
| 2008/0128689 A1 | 6/2008 | Lee et al. |
| 2008/0129195 A1 | 6/2008 | Ishizaki et al. |
| 2008/0166834 A1 | 7/2008 | Kim et al. |
| 2008/0182358 A1 | 7/2008 | Cowdery-Corvan et al. |
| 2008/0224133 A1 | 9/2008 | Park et al. |
| 2008/0254569 A1 | 10/2008 | Hoffman et al. |
| 2008/0258139 A1 | 10/2008 | Ito et al. |
| 2008/0258140 A1 | 10/2008 | Lee et al. |
| 2008/0258141 A1 | 10/2008 | Park et al. |
| 2008/0258143 A1 | 10/2008 | Kim et al. |
| 2008/0259254 A1 | 10/2008 | Kikuchi et al. |
| 2008/0296568 A1 | 12/2008 | Ryu et al. |
| 2009/0027592 A1 | 1/2009 | Motomatsu |
| 2009/0068773 A1 | 3/2009 | Lai et al. |
| 2009/0073325 A1 | 3/2009 | Kuwabara et al. |
| 2009/0114910 A1 | 5/2009 | Chang |
| 2009/0134399 A1 | 5/2009 | Sakakura et al. |
| 2009/0152506 A1 | 6/2009 | Umeda et al. |
| 2009/0152541 A1 | 6/2009 | Maekawa et al. |
| 2009/0153761 A1 | 6/2009 | Park et al. |
| 2009/0269880 A1 | 10/2009 | Itagaki et al. |
| 2009/0278122 A1 | 11/2009 | Hosono et al. |
| 2009/0280600 A1 | 11/2009 | Hosono et al. |
| 2010/0065844 A1 | 3/2010 | Tokunaga |
| 2010/0092800 A1 | 4/2010 | Itagaki et al. |
| 2010/0097838 A1 | 4/2010 | Tanaka et al. |
| 2010/0109002 A1 | 5/2010 | Itagaki et al. |
| 2010/0195028 A1 | 8/2010 | Kubota et al. |

FOREIGN PATENT DOCUMENTS

| | | |
|---|---|---|
| JP | 60-198861 A | 10/1985 |
| JP | 63-210022 A | 8/1988 |
| JP | 63-210023 A | 8/1988 |
| JP | 63-210024 A | 8/1988 |
| JP | 63-215519 A | 9/1988 |
| JP | 63-239117 A | 10/1988 |
| JP | 63-265818 A | 11/1988 |
| JP | 05-251705 A | 9/1993 |
| JP | 08-264794 A | 10/1996 |
| JP | 11-505377 | 5/1999 |
| JP | 2000-044236 A | 2/2000 |
| JP | 2000-150900 A | 5/2000 |
| JP | 2002-076356 A | 3/2002 |
| JP | 2002-289859 A | 10/2002 |
| JP | 2003-086000 A | 3/2003 |
| JP | 2003-086808 A | 3/2003 |
| JP | 2004-103957 A | 4/2004 |
| JP | 2004-273614 A | 9/2004 |
| JP | 2004-273732 A | 9/2004 |
| JP | 2007-096055 | 4/2007 |
| JP | 2007-123861 | 5/2007 |
| JP | 2008-130814 A | 6/2008 |
| JP | 2008-241728 A | 10/2008 |
| JP | 2009-031432 A | 2/2009 |
| JP | 2009-047879 A | 3/2009 |
| JP | 2009-169386 A | 7/2009 |
| JP | 2009-182194 | 8/2009 |
| JP | 2009-252821 A | 10/2009 |
| JP | 2010-074061 A | 4/2010 |
| JP | 2011-014761 A | 1/2011 |
| WO | WO-2004/114391 | 12/2004 |
| WO | WO-2008/062720 | 5/2008 |
| WO | WO-2008/114588 | 9/2008 |

OTHER PUBLICATIONS

International Search Report (Application No. PCT/JP2010/072303) Dated Mar. 8, 2011.

Written Opinion (Application No. PCT/JP2010/072303) Dated Mar. 8, 2011.

Fortunato.E et al., "Wide-Bandgap High-Mobility ZnO Thin-Film Transistors Produced at Room Temperature,", Appl. Phys. Lett. (Applied Physics Letters) , Sep. 27, 2004, vol. 85, No. 13, pp. 2541-2543.

Dembo.H et al., "RFCPUS on Glass and Plastic Substrates Fabricated by TFT Transfer Technology,", IEDM 05: Technical Digest of International Electron Devices Meeting, Dec. 5, 2005, pp. 1067-1069.

Ikeda.T et al., "Full-Functional System Liquid Crystal Display Using CG-Silicon Technology,", SID Digest '04 : SID International Symposium Digest of Technical Papers, 2004, vol. 35, pp. 860-863.

Nomura.K et al., "Room-Temperature Fabrication of Transparent Flexible Thin-Film Transistors Using Amorphous Oxide Semiconductors,", Nature, Nov. 25, 2004, vol. 432, pp. 488-492.

Park.J et al., "Improvements in the Device Characteristics of Amorphous Indium Gallium Zinc Oxide Thin-Film Transistors by Ar Plasma Treatment,", Appl. Phys. Lett. (Applied Physics Letters), Jun. 26, 2007, vol. 90, No. 26, pp. 262106-1-262106-3.

Takahashi.M et al., "Theoretical Analysis of IGZO Transparent Amorphous Oxide Semiconductor,", IDW '08 : Proceedings of the 15th International Display Workshops, Dec. 3, 2008, pp. 1637-1640.

Hayashi.R et al., "42.1: Invited Paper: Improved Amorphous In-Ga-Zn-O TFTS,", SID Digest '08 : SID International Symposium Digest of Technical Papers, May 20, 2008, vol. 39, pp. 621-624.

Prins.M et al., "A Ferroelectric Transparent Thin-Film Transistor,", Appl. Phys. Lett. (Applied Physics Letters), Jun. 17, 1996, vol. 68, No. 25, pp. 3650-3652.

Nakamura.M et al., "The phase relations in the $In_2O_3$-$Ga_2ZnO_4$-ZnO system at 1350° C.,", Journal of Solid State Chemistry, Aug. 1, 1991, vol. 93, No. 2, pp. 298-315.

Kimizuka.N et al., "Syntheses and Single-Crystal Data of Homologous Compounds, $In_2O_3(ZnO)m$ (m = 3, 4, and 5), $InGaO_3(ZnO)_3$, and $Ga_2O_3(ZnO)m$ (m = 7, 8, 9, and 16) in the $In_2O_3$-$ZnGa_2O_4$-ZnO Systems,", Journal of Solid State Chemistry, Apr. 1, 1995, vol. 116, No. 1, pp. 170-178.

Nomura.K et al., "Thin-Film Transistor Fabricated in Single-Crystalline Transparent Oxide Semiconductor,", Science, May 23, 2003, vol. 300, No. 5623, pp. 1269-1272.

Masuda.S et al., "Transparent thin film transistors using ZnO as an active channel layer and their electrical properties,", J. Appl. Phys. (Journal of Applied Physics), Feb. 1, 2003, vol. 93, No. 3, pp. 1624-1630.

Asakuma.N et al., "Crystallization and Reduction of Sol-Gel-Derived Zinc Oxide Films by Irradiation With Ultraviolet Lamp,", Journal of Sol-Gel Science and Technology, 2003, vol. 26, pp. 181-184.

Osada.T et al., "15.2: Development of Driver-Integrated Panel using Amorphous In-Ga-Zn-Oxide TFT,", SID Digest '09 : SID International Symposium Digest of Technical Papers, May 31, 2009, pp. 184-187.

Nomura.K et al., "Carrier transport in transparent oxide semiconductor with intrinsic structural randomness probed using single-crystalline $InGaO_3(ZnO)_5$ films,", Appl. Phys. Lett. (Applied Physics Letters), Sep. 13, 2004, vol. 85, No. 11, pp. 1993-1995.

Li.C et al., "Modulated Structures of Homologous Compounds $InMO_3(ZnO)m$ (M=In,Ga; m=Integer) Described by Four-Dimensional Superspace Group,", Journal of Solid State Chemistry, 1998, vol. 139, pp. 347-355.

Son.K et al., "42.4L: Late-News Paper: 4 Inch QVGA AMOLED Driven by the Threshold Voltage Controlled Amorphous GIZO ($Ga_2O_3$-$In_2O_3$-ZnO) TFT,", SID Digest '08 : SID International Symposium Digest of Technical Papers, May 20, 2008, vol. 39, pp. 633-636.

Lee.J et al., "World's Largest (15-Inch) XGA AMLCD Panel Using IGZO Oxide TFT,", SID Digest '08 : SID International Symposium Digest of Technical Papers, May 20, 2008, vol. 39, pp. 625-628.

Nowatari.H et al., "60.2: Intermediate Connector With Suppressed Voltage Loss for White Tandem OLEDS,", SID Digest '09 : SID International Symposium Digest of Technical Papers, May 31, 2009, vol. 40, pp. 899-902.

Kanno.H et al., "White Stacked Electrophosphorecent Organic Light-Emitting Devices Employing $MoO_3$ as a Charge-Generation Layer,", Adv. Mater. (Advanced Materials), 2006, vol. 18, No. 3, pp. 339-342.

Tsuda.K et al., "Ultra Low Power Consumption Technologies for Mobile TFT-LCDs ,", IDW '02 : Proceedings of the 9th International Display Workshops, Dec. 4, 2002, pp. 295-298.

Van de Walle.C, "Hydrogen as a Cause of Doping in Zinc Oxide,", Phys. Rev. Lett. (Physical Review Letters), Jul. 31, 2000, vol. 85, No. 5, pp. 1012-1015.

Fung.T et al., "2-D Numerical Simulation of High Performance Amorphous In-Ga-Zn-O TFTs for Flat Panel Displays,", AM-FPD '08 Digest of Technical Papers, Jul. 2, 2008, pp. 251-252, The Japan Society of Applied Physics.

Jeong.J et al., "3.1: Distinguished Paper: 12.1-Inch WXGA AMOLED Display Driven by Indium-Gallium-Zinc Oxide TFTs Array,", SID Digest '08 : SID International Symposium Digest of Technical Papers, May 20, 2008, vol. 39, No. 1, pp. 1-4.

Park.J et al., "High performance amorphous oxide thin film transistors with self-aligned top-gate structure,", IEDM 09: Technical Digest of International Electron Devices Meeting, Dec. 7, 2009, pp. 191-194.

Kurokawa.Y et al., "UHF RFCPUS on Flexible and Glass Substrates for Secure RFID Systems,", Journal of Solid-State Circuits, 2008, vol. 43, No. 1, pp. 292-299.

Ohara.H et al., "Amorphous In-Ga-Zn-Oxide TFTs with Suppressed Variation for 4.0 inch QVGA AMOLED Display,", AM-FDP '09 Digest of Technical Papers, Jul. 1, 2009, pp. 227-230, The Japan Society of Applied Physics.

Coates.D et al., "Optical Studies of the Amorphous Liquid-Cholesteric Liquid Crystal Transition:The "Blue Phase",", Physics Letters, Sep. 10, 1973, vol. 45A, No. 2, pp. 115-116.

Cho.D et al., "21.2:Al and Sn-Doped Zinc Indium Oxide Thin Film Transistors for AMOLED Back-Plane,", SID Digest '09 : SID International Symposium Digest of Technical Papers, May 31, 2009, pp. 280-283.

Lee.M et al., "15.4:Excellent Performance of Indium-Oxide-Based Thin-Film Transistors by DC Sputtering,", SID Digest '09 : SID International Symposium Digest of Technical Papers, May 31, 2009, pp. 191-193.

Jin.D et al., "65.2:Distinguished Paper:World-Largest (6.5") Flexible Full Color Top Emission AMOLED Display on Plastic Film and Its Bending Properties,", SID Digest '09 : SID International Symposium Digest of Technical Papers, May 31, 2009, pp. 983-985.

Sakata.J et al., "Development of 4.0-In. AMOLED Display With Driver Circuit Using Amorphous In-Ga-Zn-Oxide TFTs,", IDW '09 : Proceedings of the 16th International Display Workshops, 2009, pp. 689-692.

Park.J et al., "Amorphous Indium-Gallium-Zinc Oxide TFTs and Their Application for Large Size AMOLED,", AM-FPD '08 Digest of Technical Papers, Jul. 2, 2008, pp. 275-278.

Park.S et al., "Challenge to Future Displays: Transparent AM-OLED Driven by PEALD Grown ZnO TFT,", IMID '07 Digest, 2007, pp. 1249-1252.

Godo.H et al., "Temperature Dependence of Characteristics and Electronic Structure for Amorphous In-Ga-Zn-Oxide TFT,", AM-FPD '09 Digest of Technical Papers, Jul. 1, 2009, pp. 41-44.

Osada.T et al., "Development of Driver-Integrated Panel Using Amorphous In-Ga-Zn-Oxide TFT,", AM-FPD '09 Digest of Technical Papers, Jul. 1, 2009, pp. 33-36.

Hirao.T et al., "Novel Top-Gate Zinc Oxide Thin-Film Transistors (ZnO TFTs) for AMLCDS,", Journal of the SID, 2007, vol. 15, No. 1, pp. 17-22.

Hosono.H, "68.3:Invited Paper:Transparent Amorphous Oxide Semiconductors for High Performance TFT,", SID Digest '07 : SID International Symposium Digest of Technical Papers, 2007, vol. 38, pp. 1830-1833.

Godo.H et al., "P-9:Numerical Analysis on Temperature Dependence of Characteristics of Amorphous In-Ga-Zn-Oxide TFT,", SID Digest '09 : SID International Symposium Digest of Technical Papers, May 31, 2009, pp. 1110-1112.

Ohara.H et al., "21.3:4.0 In. QVGA AMOLED Display Using In-Ga-Zn-Oxide TFTs With a Novel Passivation Layer,", SID Digest '09 : SID International Symposium Digest of Technical Papers, May 31, 2009, pp. 284-287.

Miyasaka.M, "Suftla Flexible Microelectronics on Their Way to Business,", SID Digest '07 : SID International Symposium Digest of Technical Papers, 2007, vol. 38, pp. 1673-1676.

Chern.H et al., "An Analytical Model for the Above-Threshold Characteristics of Polysilicon Thin-Film Transistors,", IEEE Transactions on Electron Devices, Jul. 1, 1995, vol. 42, No. 7, pp. 1240-1246.

Kikuchi.H et al., "39.1:Invited Paper:Optically Isotropic Nano-Structured Liquid Crystal Composites for Display Applications,", SID Digest '09 : SID International Symposium Digest of Technical Papers, May 31, 2009, pp. 578-581.

Asaoka.Y et al., "29.1:Polarizer-Free Reflective LCD Combined With Ultra Low-Power Driving Technology,", SID Digest '09 : SID International Symposium Digest of Technical Papers, May 31, 2009, pp. 395-398.

Lee.H et al., "Current Status of, Challenges to, and Perspective View of AM-OLED ,", IDW '06: Proceedings of the 13th International Display Workshops, Dec. 7, 2006, pp. 663-666.

Kikuchi.H et al., "62.2:Invited Paper:Fast Electro-Optical Switching in Polymer-Stabilized Liquid Crystalline Blue Phases for Display Application,", SID Digest '07 : SID International Symposium Digest of Technical Papers, 2007, vol. 38, pp. 1737-1740.

Nakamura.M, "Synthesis of Homologous Compound with New Long-Period Structure,", NIRIM Newsletter, Mar. 1, 1995, vol. 150, pp. 1-4.

Kikuchi.H et al., "Polymer-Stabilized Liquid Crystal Blue Phases,", Nature Materials, Sep. 2, 2002, vol. 1, pp. 64-68.

Kimizuka.N et al., "Spinel,YBFE2O4, and YB2FE3O7 Types of Structures for Compounds in the In2O3 and Sc2O3-A2O3-BO Systems [A; Fe, Ga, or Al; B: Mg, Mn, Fe, Ni, Cu,or Zn] at Temperatures Over 1000° C.,", Journal of Solid State Chemistry, 1985, vol. 60, pp. 382-384.

Kitzerow.H et al., "Observation of Blue Phases in Chiral Networks,", Liquid Crystals, 1993, vol. 14, No. 3, pp. 911-916.

Costello.M et al., "Electron Microscopy of a Cholesteric Liquid Crystal and Its Blue Phase,", Phys. Rev. A (Physical Review. A), May 1, 1984, vol. 29, No. 5, pp. 2957-2959.

Meiboom.S et al., "Theory of the Blue Phase of Cholesteric Liquid Crystals,", Phys. Rev. Lett. (Physical Review Letters), May 4, 1981, vol. 46, No. 18, pp. 1216-1219.

Park.Sang-Hee et al., "42.3: Transparent ZnO Thin Film Transistor for the Application of High Aperture Ratio Bottom Emission AM-OLED Display,", SID Digest '08 : SID International Symposium Digest of Technical Papers, May 20, 2008, vol. 39, pp. 629-632.

Orita.M et al., "Mechanism of Electrical Conductivity of Transparent InGaZnO4,", Phys. Rev. B (Physical Review. B), Jan. 15, 2000, vol. 61, No. 3, pp. 1811-1816.

Nomura.K et al., "Amorphous Oxide Semiconductors for High-Performance Flexible Thin-Film Transistors,", Jpn. J. Appl. Phys. (Japanese Journal of Applied Physics) , 2006, vol. 45, No. 5B, pp. 4303-4308.

Janotti.A et al., "Native Point Defects in ZnO,", Phys. Rev. B (Physical Review. B), Oct. 4, 2007, vol. 76, No. 16, pp. 165202-1-165202-22.

Park.J et al., "Electronic Transport Properties of Amorphous Indium-Gallium-Zinc Oxide Semiconductor Upon Exposure to Water,", Appl. Phys. Lett. (Applied Physics Letters) , 2008, vol. 92, pp. 072104-1-072104-3.

Hsieh.H et al., "P-29:Modeling of Amorphous Oxide Semiconductor Thin Film Transistors and Subgap Density of States,", SID Digest '08 : SID International Symposium Digest of Technical Papers, 2008, vol. 39, pp. 1277-1280.

Janotti.A et al., "Oxygen Vacancies in ZnO,", Appl. Phys. Lett. (Applied Physics Letters) , 2005, vol. 87, pp. 122102-1-122102-3.

Oba.F et al., "Defect energetics in ZnO: A hybrid Hartree-Fock density functional study,", Phys. Rev. B (Physical Review. B), 2008, vol. 77, pp. 245202-1-245202-6.

Orita.M et al., "Amorphous transparent conductive oxide InGaO3(ZnO)m (m<4):a Zn4s conductor,", Philosophical Magazine, 2001, vol. 81, No. 5, pp. 501-505.

Hosono.H et al., "Working hypothesis to explore novel wide band gap electrically conducting amorphous oxides and examples,", J. Non-Cryst. Solids (Journal of Non-Crystalline Solids), 1996, vol. 198-200, pp. 165-169.

Mo.Y et al., "Amorphous Oxide TFT Backplanes for Large Size AMOLED Displays,", IDW '08 : Proceedings of the 6th Internartional Display Workshops, Dec. 3, 2008, pp. 581-584.

Kim.S et al., "High-Performance oxide thin film transistors passivated by various gas plasmas,", 214th ECS Meeting, 2008, No. 2317, ECS.

Clark.S et al., "First Principles Methods Using CASTEP,", Zeitschrift fur Kristallographie, 2005, vol. 220, pp. 567-570.

Lany.S et al., "Dopability, Intrinsic Conductivity, and Nonstoichiometry of Transparent Conducting Oxides,", Phys. Rev. Lett. (Physical Review Letters), Jan. 26, 2007, vol. 98, pp. 045501-1-045501-4.

Park.J et al., "Dry etching of ZnO films and plasma-induced damage to optical properties,", J. Vac. Sci. Technol. B (Journal of Vacuum Science & Technology B), Mar. 1, 2003, vol. 21, No. 2, pp. 800-803.

Oh.M et al., "Improving the Gate Stability of ZnO Thin-Film Transistors With Aluminum Oxide Dielectric Layers,", J. Electrochem. Soc. (Journal of the Electrochemical Society), 2008, vol. 155, No. 12, pp. H1009-H1014.

Ueno.K et al., "Field-Effect Transistor on SrTiO3 With Sputtered Al2O3 Gate Insulator,", Appl. Phys. Lett. (Applied Physics Letters) , Sep. 1, 2003, vol. 83, No. 9, pp. 1755-1757.

* cited by examiner

METHOD FOR MANUFACTURING DISPLAY DEVICE

TECHNICAL FIELD

The present invention relates to a method for manufacturing a display device including an oxide semiconductor.

BACKGROUND ART

In recent years, a technique for forming a thin film transistor (TFT) by using a semiconductor thin film (having a thickness of approximately several nanometers to several hundred nanometers) formed over a substrate having an insulating surface has attracted attention. Thin film transistors are applied to a wide range of electronic devices such as ICs or electro-optical devices, and prompt development of thin film transistors that are to be used as switching elements in image display devices, in particular, is being pushed. As a transparent electrode material needed in an image display device such as a liquid crystal display, a metal oxide typified by indium oxide is used.

In addition to a transparent electrode material, there are various kinds of metal oxides, which are used for a wide range of applications. Some metal oxides have semiconductor characteristics. Examples of metal oxides (oxide semiconductors) having semiconductor characteristics include tungsten oxide, tin oxide, indium oxide, and zinc oxide. Patent Documents 1 and 2 disclose a thin film transistor in which such an oxide semiconductor is used as a channel formation region and a display device in which the thin film transistor is used for a switching element of a pixel or the like.

Patent Document 3 discloses that the threshold voltage of a thin film transistor including an oxide semiconductor is shifted in the negative direction by ultraviolet light irradiation.

REFERENCE

[Patent Document 1] Japanese Published Patent Application No. 2007-123861
[Patent Document 2] Japanese Published Patent Application No. 2007-096055
[Patent Document 3] Japanese Published Patent Application No. 2009-182194

DISCLOSURE OF INVENTION

In an active matrix display device, electric characteristics of thin film transistors included in a circuit are important and performance of the display device depends on the electric characteristics of thin film transistors. Among the electric characteristics of thin film transistors, a threshold voltage (Vth) is particularly important. When the threshold voltage is high or is negative even when the field effect mobility is high, it is difficult to control the circuit. In the case where a thin film transistor has a high threshold voltage, the thin film transistor cannot perform a switching function as the TFT and might be a load when the TFT is driven at low voltage. In the case where the threshold voltage is negative, current tends to flow between a source electrode and a drain electrode even when the gate voltage is 0 V, that is, the thin film transistor tends to be in a so-called normally-on state.

When a thin film transistor including an oxide semiconductor layer is irradiated with ultraviolet light, the threshold voltage is shifted in the negative direction. In a process for manufacturing a display device in which an oxide semiconductor layer is used for a switching element, ultraviolet light irradiation is performed in many steps typified by a step of attachment of substrates using an ultraviolet curable resin. That is, there is a problem in that when a display device in which a thin film transistor including an oxide semiconductor layer is used for a switching element is manufactured, the threshold voltage of the thin film transistor shifts in the negative direction in the manufacturing process.

In view of the problem, one object is to provide a method for manufacturing a display device in which shift of the threshold voltage of a thin film transistor including an oxide semiconductor layer can be suppressed even when ultraviolet light irradiation is performed in the process for manufacturing the display device.

One embodiment of the present invention is a method for manufacturing a display device in which ultraviolet light irradiation is performed at least once, a thin film transistor including an oxide semiconductor layer is used for a switching element, and heat treatment for repairing damage to the oxide semiconductor layer caused by the ultraviolet light irradiation is performed after all the steps of ultraviolet light irradiation are completed.

One embodiment of the present invention is a method for manufacturing a display device including the steps of: forming a thin film transistor including an oxide semiconductor layer and being electrically connected to a pixel electrode in a pixel portion over a first substrate; forming a sealant including an ultraviolet curable resin over any one of the first substrate and a second substrate so as to surround a region including at least the pixel portion; dropping liquid crystal to form a liquid crystal layer in the region surrounded by the sealant formed over any one of the first substrate and the second substrate; attaching the first substrate and the second substrate so that the region including the pixel portion and the liquid crystal layer overlap with each other; curing the sealant with ultraviolet light irradiation; and performing heat treatment for repairing a damage to the oxide semiconductor layer caused by irradiation with the ultraviolet light.

One embodiment of the present invention is a method for manufacturing a display device including the steps of: forming a thin film transistor including an oxide semiconductor layer and being electrically connected to a pixel electrode in a pixel portion over a first substrate; forming a sealant including an ultraviolet curable resin over any one of the first substrate and a second substrate so as to have an opening and surround a region including the pixel portion; attaching the first substrate and the second substrate so that the region including the pixel portion and the region surrounded by the sealant overlap with each other; curing the sealant with ultraviolet light irradiation; injecting liquid crystal to form a liquid crystal layer in a region surrounded by the first substrate, the second substrate, and the sealant; and performing heat treatment for repairing a damage to the oxide semiconductor layer caused by irradiation with the ultraviolet light.

One embodiment of the present invention is a method for manufacturing a display device including the steps of: forming a thin film transistor including an oxide semiconductor layer and being electrically connected to a pixel electrode in a pixel portion over a first substrate; forming a sealant including an ultraviolet curable resin over any one of the first substrate and a second substrate so as to surround a region including at least the pixel portion; dropping a liquid crystal including an ultraviolet curable resin to form a liquid crystal layer in the region surrounded by the sealant formed over any one of the first substrate and the second substrate; attaching the first substrate and the second substrate so that the region including the pixel portion and the liquid crystal layer overlap with each other; curing the sealant and the liquid crystal including the ultraviolet curable resin with ultraviolet light irradiation; and performing heat treatment for repairing a damage to the oxide semiconductor layer caused by irradiation with the ultraviolet light.

The liquid crystal may exhibit a blue phase. The pixel electrode is preferably subjected to surface treatment by ultraviolet light irradiation. The sealant may be irradiated with ultraviolet light to be temporarily cured immediately after formation of the sealant. A pair of substrates which are attached to each other may be divided after curing of the sealant. The sealant may be formed in the driver circuit portion in which another thin film transistor including an oxide semiconductor layer is formed.

One embodiment of the present invention is a method for manufacturing a display device including the steps of: forming a thin film transistor including an oxide semiconductor layer in a pixel portion over a first substrate; forming a light-emitting element electrically connected to the thin film transistor over the thin film transistor; forming a sealant including an ultraviolet curable resin over any one of the first substrate and a second substrate so as to surround a region including at least the pixel portion; attaching the first substrate and the second substrate; curing the sealant with ultraviolet light irradiation; and performing heat treatment for repairing a damage to the oxide semiconductor layer caused by irradiation with the ultraviolet light.

The region surrounded by the first substrate, the second substrate, and the sealant may be filled with a filler including an ultraviolet curable resin, and the sealant and the filler may be irradiated with ultraviolet light to be cured.

The heat treatment is preferably performed for greater than or equal to 1 hour and less than or equal to 15 hours. Further, the heat treatment is preferably performed at greater than or equal to 125° C. and less than or equal to 250° C.

Note that the display devices include display elements in this specification. As the display element, a liquid crystal element (also referred to as a liquid crystal display element) or a light-emitting element (also referred to as a light-emitting display element) can be used. The light-emitting element includes, in its category, an element whose luminance is controlled by a current or a voltage, and specifically includes an inorganic electroluminescent (EL) element, an organic EL element, and the like. Further, a display medium whose contrast is changed by an electric effect, such as electronic ink, can be applied to the display device.

In addition, the display device includes a panel in which the display element is sealed, and a module in which an IC or the like including a controller is mounted on the panel. Furthermore, an element substrate, which corresponds to one embodiment before the display element is completed in a manufacturing process of the display device, is provided with a means for supplying current to the display element in each of a plurality of pixels. Specifically, the element substrate may be in a state in which only a pixel electrode of the display element is formed, a state after formation of a conductive film to be a pixel electrode and before etching of the conductive film to form the pixel electrode, or any other states.

Note that the display device in this specification means an image display device, a display device, or a light source (including a lighting device). Further, the display device includes all the following modules in its category: a module including a connector such as a flexible printed circuit (FPC), tape automated bonding (TAB) tape, or a tape carrier package (TCP); a module having TAB tape or a TCP which is provided with a printed wiring board at the end thereof; and a module having an integrated circuit (IC) which is directly mounted on a display element by a chip on glass (COG) method.

In this specification, the wavelength of ultraviolet light used for ultraviolet light irradiation is greater than or equal to 200 nm and less than or equal to 500 nm (preferably greater than or equal to 250 nm and less than 450 nm). In general, the wavelength of ultraviolet light is less than or equal to 400 nm; however, the wavelength of ultraviolet light used for ultraviolet light irradiation also includes an electromagnetic wave of greater than or equal to 400 nm.

When a display device is manufactured according to the method described in one embodiment of the present invention, damage to an oxide semiconductor layer caused by ultraviolet light irradiation can be repaired. According to this, even when the oxide semiconductor layer of the thin film transistor included in the display device is damaged by ultraviolet light in the process for manufacturing the display device, shift of the threshold voltage of the thin film transistor in the negative direction due to the damage by ultraviolet light irradiation can be suppressed.

Moreover, the thin film transistor that functions as a switching element in the display device can be normally off, so that the display device having low power consumption and high reliability can be manufactured.

BEST MODE FOR CARRYING OUT THE INVENTION

Figure 1:
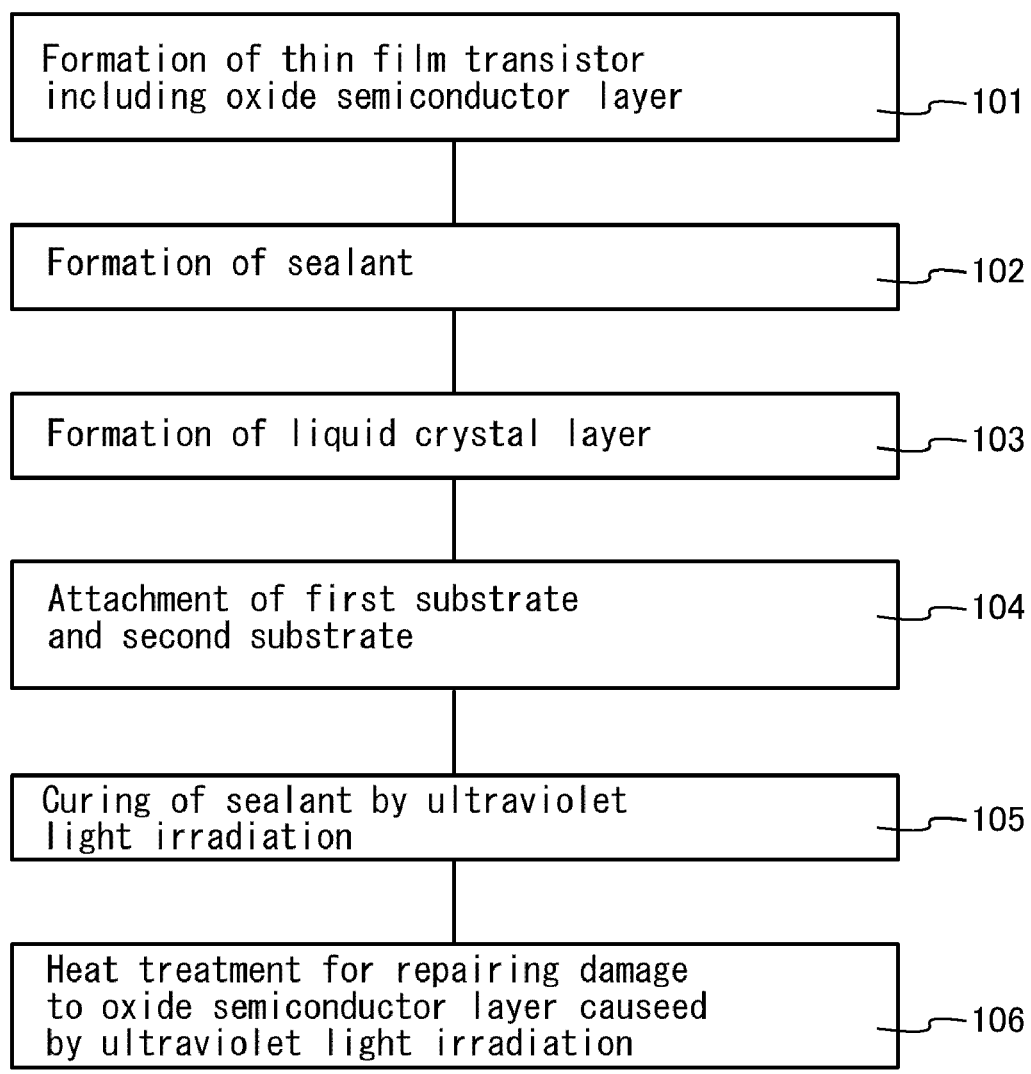
FIG. 1 is a flow chart of a method for manufacturing a display device according to one embodiment of the present invention.

Hereinafter, embodiments of the present invention will be described in detail with reference to the accompanying drawings. However, the present invention is not limited to the description below, and it is easily understood by those skilled in the art that modes and details disclosed herein can be modified in various ways. Therefore, the present invention is not construed as being limited to description of the embodiments.

Note that for easy understanding, the position, size, range and the like of each component illustrated in the drawings are not actual ones in some cases. Therefore, the present invention is not limited to the position, size, range and the like disclosed in the drawings.

Note that in this specification, ordinal numbers such as "first", "second", and "third" are used in order to avoid confusion among components, and the terms do not limit the components numerically.

Embodiment 1

In this embodiment, a method for manufacturing a liquid crystal display device illustrated in FIG. 2, in which a thin film transistor including an oxide semiconductor layer is used, will be described with reference to a flow chart of FIG. 1. The flow chart of FIG. 1 shows steps for manufacturing the liquid crystal display device illustrated in FIG. 2 by a one drop filling method (an ODF method).

First, a structure of the liquid crystal display device illustrated in FIG. 2 will be described. In the liquid crystal display device, a liquid crystal layer 208 is sandwiched between a first substrate 201 that is an active matrix substrate and a second substrate 206 that is a counter substrate. A sealant 205 is formed between the first substrate 201 and the second substrate 206 so as to surround a pixel portion 202 and a driver circuit portion 204, and retains the distance (a cell gap) between the first substrate 201 and the second substrate 206 with a spacer 235.

Figure 2:
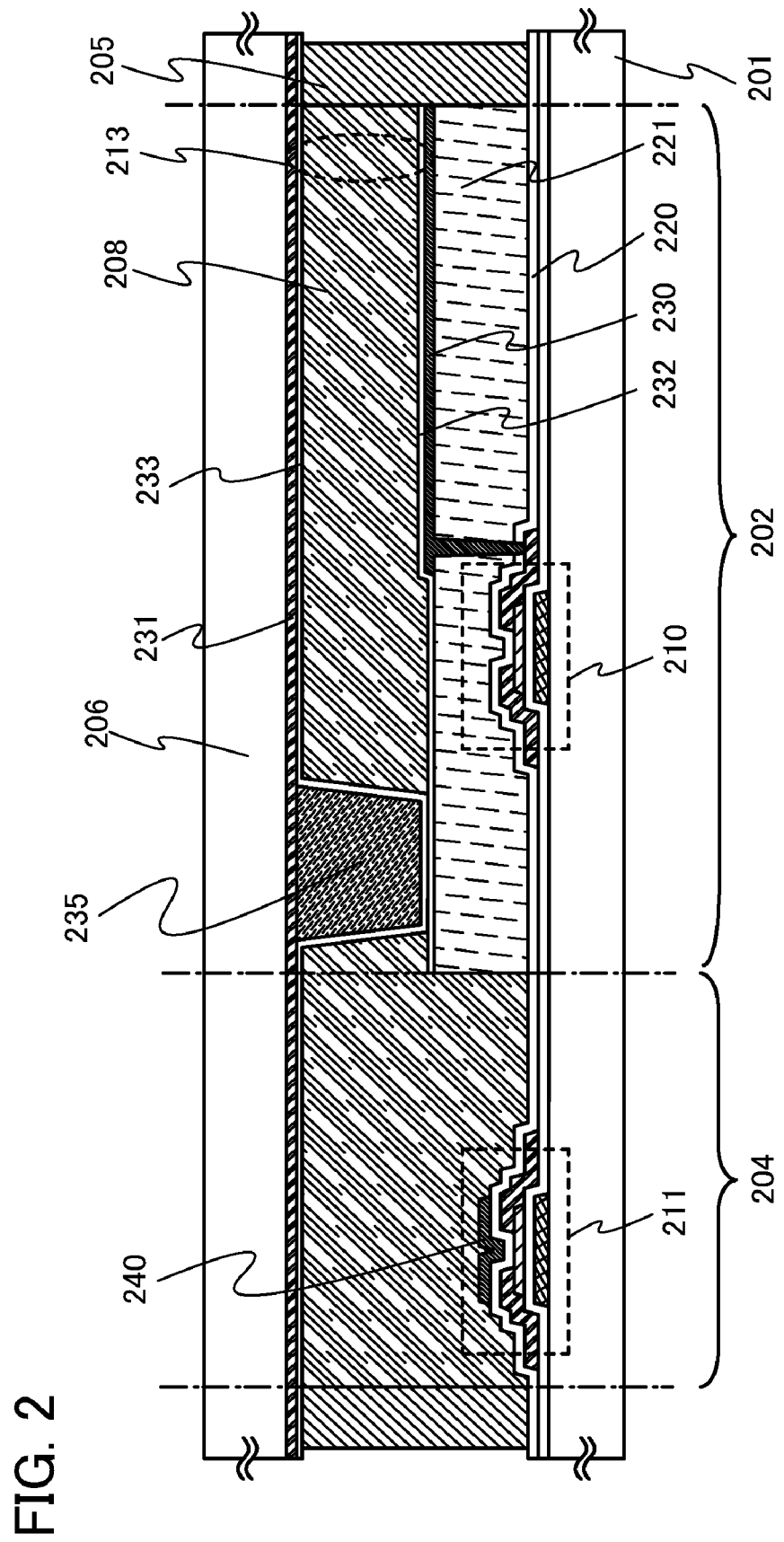
FIG. 2 is a cross-sectional view of a display device according to one embodiment of the present invention.

The liquid crystal display device illustrated in FIG. 2 has the following structure on the active matrix substrate side. Over the first substrate 201, a thin film transistor 210 including an oxide semiconductor layer is formed in the pixel portion 202 and a thin film transistor 211 including an oxide semiconductor layer is formed in the driver circuit portion 204. An insulating layer 220 and an insulating layer 221 are formed over the thin film transistor 210 in the pixel portion 202, a pixel electrode layer 230 electrically connected to one of a source electrode layer and a drain electrode layer of the thin film transistor is formed over the insulating layer 221, and an alignment film 232 is formed over the pixel electrode layer 230 and the insulating layer 221. Further, a conductive layer 240 is formed over the thin film transistor 211 in the driver circuit portion 204.

On the counter substrate side of the liquid crystal display device illustrated in FIG. 2, when the counter substrate is used as a reference, a counter electrode layer 231 is formed over the second substrate 206, and an alignment film 233 is formed over the counter electrode layer 231. Further, a spacer 235 is provided over the counter electrode layer 231.

A portion in which the pixel electrode layer 230 over the first substrate 201, the counter electrode layer 231 over the second substrate 206, and the liquid crystal layer 208 overlap with each other corresponds to a liquid crystal element 213.

Note that in this embodiment, the driver circuit portion 204 is formed inside the frame of the sealant 205; however, the driver circuit portion 204 is not necessarily formed in such a manner, and the entire or part of the driver circuit portion 204 may be formed outside the frame of the sealant 205. In the case of forming the driver circuit portion outside the frame of the sealant 205, the driver circuit portion may be formed over another substrate, and then mounted by a COG method, a wire bonding method, a TAB method or the like. For example, a scan line driver circuit portion may be formed with a pixel portion inside the frame of the sealant over one substrate and a signal line driver circuit portion may be formed over another substrate, and then mounted over the active matrix substrate.

Examples of a method for displaying a liquid crystal display device described in this embodiment are a twisted nematic (TN) mode, a super twisted nematic (STN) mode, an in-plane-switching (IPS) mode, a fringe field switching (FFS) mode, a multi-domain vertical alignment (MVA) mode, a patterned vertical alignment (PVA) mode, an advanced super view (ASV) mode, an axially symmetric aligned microcell (ASM) mode, an optical compensated birefringence (OCB) mode, an electrically controlled birefringence (ECB) mode, a ferroelectric liquid crystal (FLC) mode, an anti-ferroelectric liquid crystal (AFLC) mode, a polymer dispersed liquid crystal (PDLC) mode, a polymer network liquid crystal (PNLC) mode, a guest-host mode, and a blue phase mode.

Next, in accordance with the flow chart of FIG. 1, a method for manufacturing the liquid crystal display device illustrated in FIG. 2 by a one drop filling method (an ODF method) will be described.

In this embodiment, in accordance with the flow chart of FIG. 1, formation of a thin film transistor including an oxide semiconductor layer (a step 101), formation of a sealant (a step 102), formation of a liquid crystal layer (a step 103), attachment of a first substrate and a second substrate (a step 104), curing of the sealant by ultraviolet light irradiation (a step 105), and heat treatment for repairing damage to the oxide semiconductor layer caused by the ultraviolet light irradiation (a step 106) will be described in this order.

First, formation of the thin film transistor including an oxide semiconductor layer (the step 101) will be described.

Over the first substrate 201, the thin film transistor 210 is formed in the pixel portion 202 and the thin film transistor 211 is formed in the driver circuit portion 204. Next, in the pixel portion 202, the insulating layer 220 and the insulating layer 221 are formed over the thin film transistor 210. An opening is formed in the insulating layer 220 and the insulating layer 221 so as to reach one of the source electrode and the drain electrode of the thin film transistor 210, and the pixel electrode layer 230 electrically connected to one of the source electrode and the drain electrode of the thin film transistor 210 through the opening can be formed over the insulating layer 221. Then, the alignment film 232 is formed over the insulating layer 221 and the pixel electrode layer 230. At this time, the insulating layer 221 is not necessarily formed in the driver circuit portion 204; thus, the conductive layer 240 can be formed over the thin film transistor 211 simultaneously in the formation of the pixel electrode layer 230.

Note that as the first substrate 201, a light-transmitting substrate can be employed, and glass, ceramic, or plastic can be used. As plastic, a fiberglass-reinforced plastics (FRP) plate, a polyvinyl fluoride (PVF) film, a polyester film, or an acrylic resin film can be used.

The thin film transistor 210 is a bottom gate thin film transistor formed in the following manner: a gate electrode layer is formed over the first substrate 201, a gate insulating layer is formed over the gate electrode layer, an oxide semiconductor layer is formed over the gate insulating layer, and a source electrode layer and a drain electrode layer are formed over the oxide semiconductor layer.

The gate electrode layer of the thin film transistor 210 is formed of a single layer or a stacked layer including a conductive material such as molybdenum, titanium, chromium, tantalum, tungsten, aluminum, copper, neodymium, and scandium, an alloy of any of these elements, or a compound (e.g., nitride) of any of these elements, by a film formation method such as a PVD method or a CVD method. As illustrated in FIG. 2, a gate electrode layer is formed to protect an oxide semiconductor layer from light and thus the oxide semiconductor layer can be prevented from being directly irradiated with ultraviolet light or the like after a liquid crystal display device is completed.

The gate insulating layer of the thin film transistor 210 is formed of a single layer or a stacked layer including any of silicon oxide, silicon nitride, silicon oxynitride, aluminum oxide, hafnium oxide, tantalum oxide, and the like, by a CVD method, a sputtering method, or the like. There is no particular limitation on the thickness of the gate insulating layer; the thickness can be greater than or equal to 10 nm and less than or equal to 500 nm, for example. Note that the gate insulating layer of the thin film transistor 210 is also included in the transistor 211 and formed to cover the first substrate 201.

The oxide semiconductor layer of the thin film transistor 210 is preferably formed by a sputtering method. As the oxide semiconductor layer, an oxide of four metal elements such as an In—Sn—Ga—Zn—O-based oxide semiconductor; an oxide of three metal elements such as an In—Ga—Zn—O-based oxide semiconductor, an In—Sn—Zn—O-based oxide semiconductor, an In—Al—Zn—O-based oxide semiconductor, a Sn—Ga—Zn—O-based oxide semiconductor, an Al—Ga—Zn—O-based oxide semiconductor, or a Sn—Al—Zn—O-based oxide semiconductor; an oxide of two metal elements such as an In—Zn—O-based oxide semiconductor, a Sn—Zn—O-based oxide semiconductor, an Al—Zn—O-based oxide semiconductor, a Zn—Mg—O-based oxide semiconductor, a Sn—Mg—O-based oxide semiconductor, or an In—Mg—O-based oxide semiconductor; or a single-component metal oxide such as an In—O-based oxide semiconductor, a Sn—O-based oxide semiconductor, or a Zn—O-based oxide semiconductor can be used. Note that silicon may be added to the metal oxide. For example, the oxide semiconductor layer may be formed using a target containing $SiO_2$ at greater than or equal to 2 wt % and less than or equal to 10 wt %.

In particular, when an In—Ga—Zn—O-based metal oxide is used, a thin film transistor in which the resistance is sufficiently high when there is no electric field and thus the off-current is sufficiently low and the field effect mobility is high can be realized. Therefore, an In—Ga—Zn—O-based metal oxide is suitable for an oxide semiconductor layer used in a thin film transistor.

As a typical example of the In—Ga—Zn—O-based metal oxide, one represented by $InGaO_3 (ZnO)_m$ (m>0) is given. Alternatively, there is a metal oxide represented by $InMO_3 (ZnO)_m$ (m>0) in which M is used instead of Ga. Here, M denotes one or more of metal elements selected from gallium (Ga), aluminum (Al), iron (Fe), nickel (Ni), manganese (Mn), and cobalt (Co) and the like. For example, M can be Ga, Ga and Al, Ga and Fe, Ga and Ni, Ga and Mn, Ga and Co, or the like. Note that the above compositions are derived from the crystal structures and just an example.

The thickness of the oxide semiconductor layer is greater than or equal to 1 nm and less than or equal to 200 nm, preferably greater than or equal to 5 nm and less than or equal to 30 nm. Note that an appropriate thickness differs depending on an oxide semiconductor material, and the thickness is set as appropriate depending on the material to be used.

Note that heat treatment is preferably performed on the oxide semiconductor layer. By this heat treatment, the oxide semiconductor layer can be dehydrated or dehydrogenated. The temperature of the heat treatment is set in the range of 300° C. to 750° C., preferably 400° C. to 700° C. For example, the substrate is introduced into an electric furnace in which a resistance heating element or the like is used and the oxide semiconductor layer is subjected to heat treatment at 450° C. under a nitrogen atmosphere for one hour. During the treatment, the oxide semiconductor layer is not exposed to the atmosphere so that entry of hydrogen (including water) is prevented. Note that the heat treatment can also be called as dehydrogenation (dehydration) treatment because it is effective in dehydrogenating (dehydrating) the oxide semiconductor layer.

A heat treatment apparatus is not limited to an electric furnace and can be an apparatus for heating an object by thermal radiation or thermal conduction from a medium such as a heated gas. For example, a rapid thermal anneal (RTA) apparatus such as a gas rapid thermal anneal (GRTA) apparatus or a lamp rapid thermal anneal (LRTA) apparatus can be used.

The source electrode layer or the drain electrode layer of the thin film transistor 210 can be formed by a PVD method such as a sputtering method, or a CVD method such as a plasma CVD method. As a material for the source electrode layer or the drain electrode layer, an element selected from aluminum, chromium, copper, tantalum, titanium, molybdenum, and tungsten; an alloy containing any of these elements as a component; or the like can be used. Alternatively, one or more materials selected from manganese, magnesium, zirconium, beryllium, and thorium may be used. Aluminum combined with one or more of elements selected from titanium, tantalum, tungsten, molybdenum, chromium, neodymium, and scandium may be used. The source electrode layer or the drain electrode layer can have a single-layer structure or a stacked structure including two or more layers.

The thin film transistor 211 formed in the driver circuit portion 204 can be also formed to have the same or substantially the same structure using the same or substantially the same material as those of the thin film transistor 210. However, as described above, in the thin film transistor 211, the conductive layer 240 is preferably formed in a position overlapping with a channel formation region of the oxide semiconductor layer with the insulating layer 220 provided between the conductive layer 240 and the channel formation region. Formation of the conductive layer 240 in the position overlapping with the channel formation region of the oxide semiconductor layer can reduce the amount of shift in the threshold voltage of the thin film transistor 211 in a BT test. The potential of the conductive layer 240 may be the same as or different from that of a gate electrode layer of the thin film transistor 211, and the conductive layer 240 can also function as a second gate electrode layer of the thin film transistor 211. Alternatively, the potential of the conductive layer 240 may be GND or 0 V, or the conductive layer 240 may be in a floating state.

Note that in this embodiment, an example where the thin film transistor 210 and the thin film transistor 211 are bottom gate transistors is described; however, this embodiment is not limited thereto, and a top gate transistor or a known transistor with another structure may be used.

The insulating layer 220 functions as a protective insulating layer of the oxide semiconductor layer. The insulating layer 220 is formed of a single layer or a stacked layer including any of silicon oxide, silicon nitride, silicon oxynitride, and the like, by a sputtering method or the like. The insulating layer 220 is formed, and after that, heat treatment is preferably performed under an inert gas atmosphere or an oxygen gas atmosphere (preferably at greater than or equal to 200° C. and less than or equal to 400° C., for example, at greater than or equal to 250° C. and less than or equal to 350° C.). The heat treatment can reduce variation in electric characteristics of the transistor. By the heat treatment, oxygen is supplied from the insulating layer including oxygen to the oxide semiconductor layer; thus, defect level in an energy gap caused by oxygen deficiency can also be reduced.

The insulating layer 221 functions as a planarization film for reducing roughness of the thin film transistor 210. The insulating layer 221 can be formed using a heat-resistant organic material, such as polyimide, acrylic, benzocyclobutene, polyamide, or epoxy. Other than such organic materials, it is also possible to use a low-dielectric constant material (a low-k material), a siloxane-based resin, PSG (phosphosilicate glass), BPSG (borophosphosilicate glass), or the like. Note that the insulating layer 221 may be formed by stacking a plurality of insulating layers formed using any of these materials.

Note that the siloxane-based resin corresponds to a resin including a Si—O—Si bond formed using a siloxane-based material as a starting material. The siloxane-based resin may include an organic group (e.g., an alkyl group or an aryl group) or a fluoro group as a substituent. In addition, the organic group may include a fluoro group.

There is no particular limitation on the formation method of the insulating layer 221, and the following can be employed depending on the material: a method such as a sputtering method, an SOG method, a spin coating, dip coating, spray coating, or a droplet discharging method (e.g., ink jetting, screen printing, or offset printing), or with a tool (equipment) such as a doctor knife, a roll coater, a curtain coater, or a knife coater. A baking step of the insulating layer 221 also serves as heat treatment of the oxide semiconductor layer; thus, a liquid crystal display device can be manufactured efficiently.

In the case of a transmissive liquid crystal display device, for the pixel electrode layer 230, a light-transmitting conductive material such as indium tin oxide (hereinafter referred to as ITO), indium zinc oxide, indium tin oxide to which silicon oxide is added, indium oxide containing tungsten oxide, indium zinc oxide containing tungsten oxide, indium oxide containing titanium oxide, or indium tin oxide containing titanium oxide can be used. Note that for the conductive layer 240 that is formed at the same time as the pixel electrode layer 230, the conductive material having a light transmitting property used for the pixel electrode layer 230 can be used.

The pixel electrode layer 230 can be formed using a conductive composition including a conductive high molecule (also referred to as a conductive polymer). The pixel electrode formed using the conductive composition preferably has a sheet resistance of less than or equal to 10000 ohms per square and a light transmittance of greater than or equal to 70% at a wavelength of 550 nm. Further, the resistivity of the conductive high molecule included in the conductive composition is preferably less than or equal to 0.1 Ω·cm. As the conductive high molecule, a so-called π electron conjugated conductive high molecule can be used. For example, polyaniline or a derivative thereof, polypyrrole or a derivative thereof, polythiophene or a derivative thereof, a copolymer of two or more kinds of them, and the like are given.

On the other hand, in the case of a reflective liquid crystal display device, a metal electrode layer having high reflectivity is used as the pixel electrode layer 230. Specifically, aluminum, silver, or the like is used. Further, the reflectivity is increased by making the surface of the pixel electrode layer 230 rough. Therefore, a base film of the pixel electrode layer 230 may be made rough.

Further, in the case of a semi-transmissive liquid crystal display device, a transmissive material and a reflective material are used for the pixel electrode layer 230.

After the formation of the pixel electrode layer 230, surface treatment may be performed on the pixel electrode layer 230 by ultraviolet light irradiation. The oxide semiconductor layer of the thin film transistor 210 is damaged when the pixel electrode layer 230 is irradiated with ultraviolet light; however, heat treatment performed later can repair damage to the oxide semiconductor layer caused by ultraviolet light irradiation.

The alignment film 232 can be formed using an organic resin such as polyimide or polyvinyl alcohol or an inorganic material such as silicon oxide. After the formation of the alignment film 232, the alignment film 232 is subjected to rubbing treatment so that liquid crystal molecules to be formed in a later step are oriented at a certain pretilt angle. Note that in the case where the alignment film 232 is formed using an inorganic material such as silicon oxide, the alignment film 232 having alignment characteristics can be formed by an evaporation method without rubbing treatment.

As the alignment film 232, an alignment film in which liquid crystal is aligned by ultraviolet light irradiation may be used. As such an alignment film, a photosensitive resin such as polyvinylcinnamate (PVCi) or the like may be used. When such an alignment film is employed, rubbing treatment is unnecessary; thus, electrostatic discharge damage caused by the rubbing treatment can be prevented and defects and damage of the liquid crystal display device can be reduced in the manufacturing process. The oxide semiconductor layer of the thin film transistor 210 is damaged when the alignment film 232 is irradiated with ultraviolet light; however, heat treatment performed later can repair damage to the oxide semiconductor layer caused by ultraviolet light irradiation.

A method for manufacturing the counter substrate formed of the second substrate 206 will be described here. The counter electrode layer 231 is formed over the second substrate 206, and the alignment film 233 is formed over the counter electrode layer 231. The second substrate 206, the counter electrode layer 231, and the alignment film 233 can be formed to have the same or substantially the same structure using the same or substantially the same material as those of the first substrate 201, the pixel electrode layer 230, and the alignment film 232, respectively.

The counter electrode layer 231 is electrically connected to a common potential line that is provided over the first substrate 201. The counter electrode layer 231 and the common potential line can be electrically connected to each other using a common connecting portion, with conductive particles which are arranged between the pair of substrates provided therebetween. Note that the conductive particles can be contained in the sealant 205.

In FIG. 2, the spacer 235 is formed over the counter electrode layer 231 using the counter substrate as a reference, but the spacer 235 may be formed over the alignment film 233. Alternatively, the spacer 235 may be formed over the alignment film 232 on the active matrix substrate side, not the counter substrate side. The spacer 235 is a columnar spacer obtained by selective etching of an insulating film and is provided in order to control the distance (a cell gap) between the pixel electrode layer 230 and the counter electrode layer 231. Note that a spherical spacer may be used for the spacer 235.

Next, formation of the sealant (the step 102) will be described.

The sealant 205 is formed by a screen printing method, or using an ink-jet apparatus or a dispensing apparatus so as to surround the pixel portion 202 and the driver circuit portion 204 (closed-loop shape) over the first substrate 201. The sealant may be formed to have a rectangular shape, a circular shape, an elliptical shape, a polygonal shape, or the like, as appropriate. The sealant 205 does not necessarily surround the driver circuit portion 204 as long as it surrounds at least the pixel portion 202. For example, the sealant 205 may be formed so as to surround part of the driver circuit portion 204; alternatively, the driver circuit portion 204 may be formed outside the frame of the sealant 205. The sealant 205 may be formed in the driver circuit portion 204 and thus a frame of the liquid crystal display device can be narrowed.

The sealant 205 is not necessarily formed over the first substrate 201 and may be formed over the second substrate 206. In the case where the sealant 205 is formed over the second substrate 206, the sealant 205 is formed so that the sealant 205 over the second substrate 206 surrounds at least the pixel portion 202 when the first substrate 201 and the second substrate 206 are attached to each other in a later step.

The sealant 205 is preferably formed using a material including an ultraviolet curable resin. As the ultraviolet curable resin, a resin in which an acrylic-based resin and an epoxy-based resin are mixed can be used. Further, a UV initiator, a thermosetting agent, a coupling agent, or the like may be mixed into the resin. Furthermore, a filler (1 μm to 24 μm in diameter) may be contained. Note that it is preferable to select as the sealant 205, a sealant which is insoluble in liquid crystal with which the sealant 205 is in contact later.

After the formation of the sealant 205, the sealant 205 may be temporarily cured by ultraviolet light irradiation. The ultraviolet light irradiation for temporarily curing the sealant 205 is performed with a low intensity for a short time as compared with ultraviolet light irradiation for curing (fully curing) the sealant in a later step. The ultraviolet curable resin of the surface of the sealant 205 can be hardened by temporarily curing the sealant 205; thus, when the liquid crystal layer 208 is in contact with the sealant 205 in a later step, an impurity can be prevented from mixing with the liquid crystal layer 208 from the sealant 205. Although the oxide semiconductor layers of the thin film transistor 211 and the thin film transistor 210 are damaged by the ultraviolet light irradiation for temporarily curing the sealant 205, such damage can be repaired by heat treatment performed in a later step.

Next, formation of the liquid crystal layer (the step 103) will be described.

The liquid crystal layer 208 is formed by dropping liquid crystal in a region surrounded by the sealant 205 formed over the first substrate 201 or the second substrate 206 by a droplet discharging method such as a dispensing method or an ink-jet method. Here, one drop of liquid crystal is dropped by an ODF method in the region surrounded by the sealant 205; however, this embodiment is not limited thereto and an appropriate amount of liquid crystal may be dropped in appropriate places in the region surrounded by the sealant 205.

For the liquid crystal layer 208, nematic liquid crystal, cholesteric liquid crystal, smectic liquid crystal, discotic liquid crystal, thermotropic liquid crystal, lyotropic liquid crystal, low-molecular liquid crystal, high-molecular liquid crystal, polymer dispersed liquid crystal (PDLC), ferroelectric liquid crystal, anti-ferroelectric liquid crystal, main-chain liquid crystal, side-chain high-molecular liquid crystal, banana-shaped liquid crystal, or the like can be used.

The liquid crystal layer 208 is formed using liquid crystal including an ultraviolet curable resin and the liquid crystal layer 208 may be applied to a liquid crystal display device having a display mode typified by a polymer dispersed liquid crystal (PDLC) mode, a polymer network liquid crystal (PNLC) mode, or a blue phase mode.

A blue phase is one of liquid crystal phases, which is generated just before a cholesteric phase changes into an isotropic phase when temperature of cholesteric liquid crystal is increased. A liquid crystal material which exhibits a blue phase includes liquid crystal, a chiral agent, a photocurable resin, and a photopolymerization initiator. The chiral agent is used to align the liquid crystal in a helical structure and to make the liquid crystal exhibit a blue phase. As an example, a liquid crystal material into which a chiral agent is mixed at 5 wt % or more can be used. The liquid crystal material which includes liquid crystal exhibiting a blue phase and a chiral agent has a short response speed of 1 msec or less and is optically isotropic; therefore, alignment treatment is not necessary and viewing angle dependence is small. Accordingly, the alignment films 232 and 233 do not need to be provided and thus rubbing treatment is not necessary. Thus, electrostatic discharge damage caused by the rubbing treatment can be prevented and defects and damage of the liquid crystal display device can be reduced in the manufacturing process, leading to an increase in productivity of the liquid crystal display device. A thin film transistor including an oxide semiconductor layer has the possibility that electrical characteristics of the thin film transistor may significantly change and deviate from the designed range by the influence of static electricity. Therefore, it is more effective to use a blue-phase liquid crystal material for a liquid crystal display in which a thin film transistor including an oxide semiconductor layer is used.

Next, attachment of the first substrate and the second substrate (the step 104) will be described.

The liquid crystal layer 208 is formed in the region surrounded by the sealant 205, and after that, the first substrate 201 and the second substrate 206 are attached to each other. The attachment of the first substrate 201 and the second substrate 206 is preferably performed under a reduced-pressure atmosphere. This is because, even when the substrates are exposed to the atmosphere after attachment, a vacuum state can be kept in the inside of the sealant 205 and the liquid crystal layer 208 can finally spread to end portions of the sealant 205 (the liquid crystal can be formed in contact with the sealant 205). Note that in the case where the sealant 205 and the liquid crystal layer 208 are formed over the second substrate 206, it is necessary that at least the pixel portion 202 of the first substrate 201 overlap with the liquid crystal layer 208.

In the case where liquid crystal exhibiting a blue phase is employed for the liquid crystal layer 208, phase transition of the liquid crystal layer 208 from an isotropic phase to a blue phase and polymer stabilization treatment are preferably performed before curing of the sealant by ultraviolet light irradiation (the step 105). The phase transition of the liquid crystal layer 208 from an isotropic phase to a blue phase is performed as follows: heat treatment is performed at a temperature within +10° C., preferably +5° C. from the phase transition temperature between the blue phase and the isotropic phase, and then the temperature is gradually decreased. The phase transition temperature between the blue phase and the isotropic phase is a temperature at which the phase changes from the blue phase to the isotropic phase when the temperature rises, or a temperature at which the phase changes from the isotropic phase to the blue phase when the temperature decreases.

The polymer stabilization treatment can be performed in such a manner that a liquid crystal material including liquid crystal, a chiral agent, an ultraviolet curable resin, and a photopolymerization initiator is irradiated with light having a wavelength with which the ultraviolet curable resin and the photopolymerization initiator are reacted, in a state in which the blue phase is exhibited. The liquid crystal layer 208 is irradiated with ultraviolet light in a state where temperature at which a blue phase is exhibited is kept; thus, the polymer stabilization treatment can be performed. The oxide semiconductor layers of the thin film transistors 210 and 211 are damaged when the liquid crystal layer 208 is irradiated with ultraviolet light as the polymer stabilization treatment; however, heat treatment performed later can repair damage to the oxide semiconductor layer caused by ultraviolet light irradiation.

Next, curing of the sealant by ultraviolet light irradiation (the step 105) will be described.

The first substrate 201 and the second substrate 206 are attached to each other, and then curing (fully curing) of the sealant 205 is performed by ultraviolet light irradiation. The ultraviolet light irradiation for fully curing the sealant 205 is performed with a high intensity for a long time as compared with ultraviolet light irradiation for temporarily curing the sealant in the above-described step. Accordingly, the ultraviolet curable resin inside the sealant 205 can be cured, which can increase adhesiveness between the first substrate 201 and the second substrate 206. The oxide semiconductor layers of the thin film transistors 210 and 211 are damaged when the sealant 205 is irradiated with ultraviolet light to be cured; however, heat treatment performed later can repair damage to the oxide semiconductor layer caused by ultraviolet light irradiation.

After the ultraviolet light irradiation of the sealant 205, heat treatment is preferably performed on the sealant 205. Accordingly, the sealant 205 can be cured more firmly. The heat treatment for curing the sealant 205 is preferably formed at a temperature of 80° C. to 200° C. for 0.5 hours to 10 hours. Heat treatment of the sealant after ultraviolet light irradiation is effective because a portion which is shaded and not irradiated with ultraviolet light in the ultraviolet light irradiation can be cured by the heat treatment.

In the case where a polymer dispersed liquid crystal (PDLC) mode or a polymer network liquid crystal (PNLC) mode is used, it is preferable that the ultraviolet light irradiation of the liquid crystal layer 208 be performed at the same time as that of the sealant 205 so that the liquid crystal layer 208 is cured and droplets are formed in the liquid crystal layer 208.

In the case where a plurality of panels is taken out from a pair of substrates (obtaining a plurality of panels), the sealant 205 is cured and then, a pair of substrates which are attached is divided. The pair of substrates which are attached can be divided using a cutting apparatus such as a scriber apparatus, a breaker apparatus, or a roll cutter.

When division is performed, the orientation of the liquid crystal layer 208 which is aligned along the alignment films 232 and 233 is disordered in some cases; thus, heat treatment for realigning the orientation of the liquid crystal layer 208 is preferably performed. Realignment of the liquid crystal layer 208 is performed in such a manner that heat treatment is performed at a temperature at which the liquid crystal layer 208 exhibits an isotropic phase or higher and the liquid crystal layer 208 is realigned when the temperature decreases. Heat treatment for realignment is preferably performed at a temperature of 80° C. to 200° C. for 10 minutes to 60 minutes, preferably at a temperature of 100° C. to 170° C. for 10 minutes to 60 minutes.

Lastly, heat treatment for repairing damage to the oxide semiconductor layer caused by the ultraviolet light irradiation (the step 106) will be described.

In the above-described process for manufacturing the liquid crystal display device, ultraviolet light irradiation is performed in a plurality of steps, such as the step for curing the sealant 205 including an ultraviolet curable resin. The oxide semiconductor layers of the thin film transistors 210 and 211 are irradiated with ultraviolet light that is direct light or reflected light, and the oxide semiconductor layers are damaged by the ultraviolet light. Accordingly, electric characteristics of a thin film transistor including the oxide semiconductor layer damaged by the ultraviolet light are decreased. In particular, the threshold voltage of the thin film transistor greatly shifts in the negative direction, a current tends to flow between a source electrode and a drain electrode even when the gate voltage is 0 V; in other words, the thin film transistor tends to be normally on.

In order to suppress such shift of the threshold voltage of the thin film transistor in the negative direction, after all the steps of ultraviolet light irradiation are completed in the process for manufacturing the liquid crystal display device, heat treatment for repairing damage to the oxide semiconductor layer caused by ultraviolet light irradiation is performed.

The heat treatment for repairing damage to the oxide semiconductor layer is performed preferably at a temperature of 50° C. to 300° C. for 0.5 hours to 24 hours, further preferably at a temperature of 125° C. to 250° C. for 1 hour to 15 hours. In addition, the heat treatment is preferably performed under an air atmosphere, an oxygen atmosphere, a nitrogen atmosphere, or a rare gas (such as helium, neon, or argon) atmosphere. The temperature of the heat treatment for repairing damage to the oxide semiconductor layer is preferably lower than that of the heat treatment for dehydration or dehydrogenation of the oxide semiconductor layer. A heating method using an electric furnace or the like can be employed for the heat treatment for repairing damage to the oxide semiconductor layer.

Realignment of atoms which exist in the oxide semiconductor layer or in the vicinity thereof is gradually carried out by the heat treatment. According to this, it is possible to repair dangling bonds formed by ultraviolet light irradiation in the oxide semiconductor layer, at the interface between the oxide semiconductor layer and the gate insulating layer, or at the interface between the oxide semiconductor layer and the insulating layer 220.

Damage to the oxide semiconductor layer by ultraviolet light can be repaired, so that a decrease in electric characteristics of the thin film transistor including the oxide semiconductor layer can be prevented and the shift of the threshold voltage in the negative direction can be suppressed.

In addition, even when the threshold voltage varies among thin film transistors formed over one substrate by ultraviolet light irradiation, the above-described heat treatment can reduce the variation in the threshold voltage.

The channel length of the thin film transistor is shortened, so that high speed operation and low power consumption of the liquid crystal display device can be achieved.

The heat treatment for repairing damage to the oxide semiconductor layer can also serve as heat treatment for curing the sealant 205 which is performed after ultraviolet light irradiation of the sealant 205.

As described above, the liquid crystal display device is manufactured by the method described in this embodiment, so that damage to an oxide semiconductor layer caused by ultraviolet light irradiation can be repaired. According to this, even when the oxide semiconductor layer of the thin film transistor included in the liquid crystal display device is damaged by ultraviolet light in the process for manufacturing the liquid crystal display device, shift of the threshold voltage of the thin film transistor in the negative direction due to the damage by ultraviolet light irradiation can be suppressed.

Moreover, the thin film transistor that functions as a switching element in the display device can be normally off, so that the liquid crystal display device having low power consumption and high reliability can be manufactured.

Embodiment 2

In this embodiment, a method for manufacturing a liquid crystal display device illustrated in FIG. 2, in which a thin film transistor including an oxide semiconductor layer is used, will be described with reference to a flow chart of FIG. 3. The flow chart of FIG. 3 shows steps for manufacturing the liquid crystal display device illustrated in FIG. 2 by a liquid crystal injection method.

Figure 3:
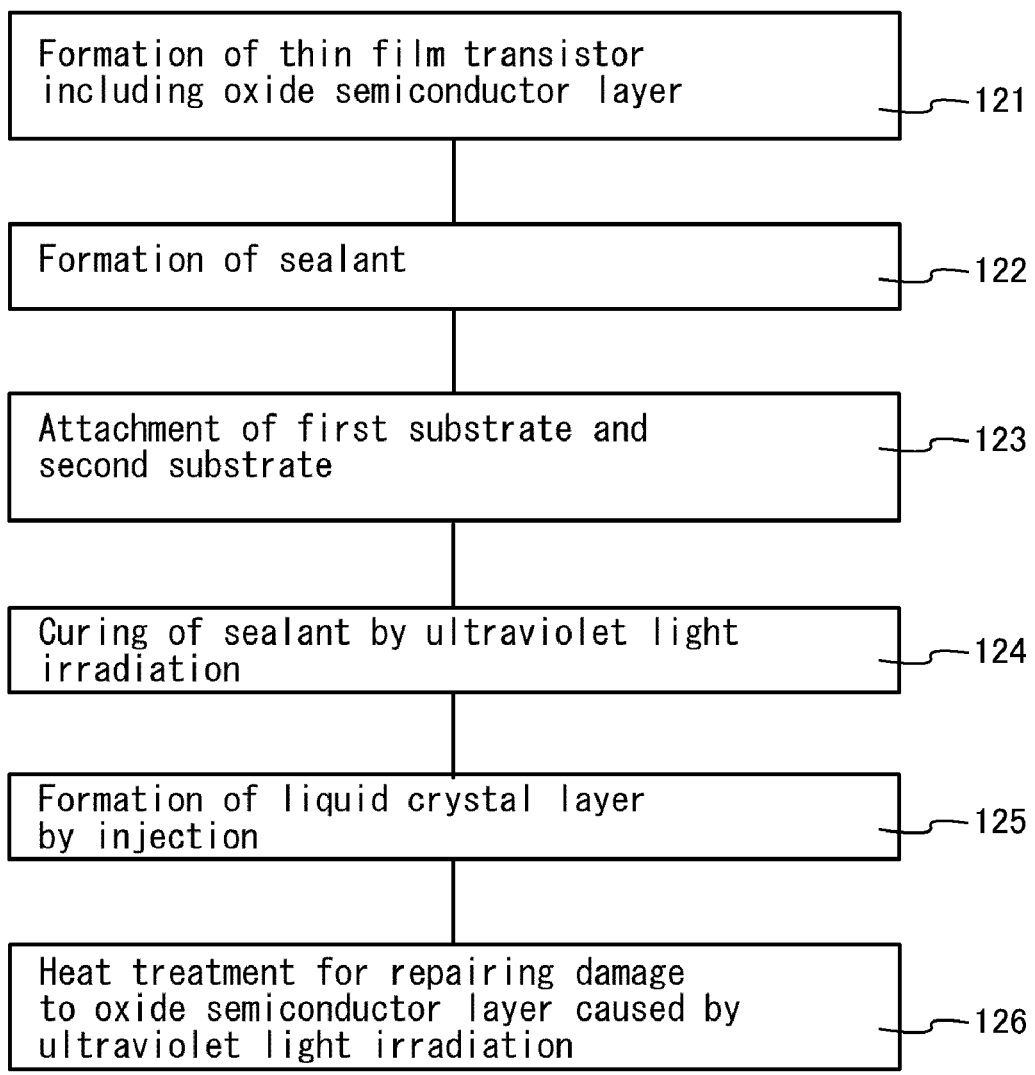
FIG. 3 is a flow chart of a method for manufacturing a display device according to one embodiment of the present invention.

In this embodiment, in accordance with the flow chart of FIG. 3, formation of a thin film transistor including an oxide semiconductor layer (a step 121), formation of a sealant (a step 122), attachment of a first substrate and a second substrate (a step 123), curing of the sealant by ultraviolet light irradiation (a step 124), formation of a liquid crystal layer by injection (a step 125), and heat treatment for repairing damage to the oxide semiconductor layer caused by the ultraviolet light irradiation (a step 126) will be described in this order. Note that the structure of the liquid crystal display device illustrated in FIG. 2 is the same as that described in Embodiment 1; therefore, Embodiment 1 is to be referred to.

Formation of the thin film transistor including an oxide semiconductor layer (the step 121) is the same or substantially the same as the formation of the thin film transistor including an oxide semiconductor layer (the step 101) described in Embodiment 1; therefore, Embodiment 1 is to be referred to.

Next, formation of the sealant (the step 122) will be described.

The sealant 205 is formed by a screen printing method, or using an ink-jet apparatus or a dispensing apparatus so as to surround the pixel portion 202 and the driver circuit portion 204 over the first substrate 201. In order to inject liquid crystal in a later step into the region surrounded by the sealant 205, an opening for injection of liquid crystal is formed in part of the sealant 205. The sealant may be formed to have a rectangular shape, a circular shape, an elliptical shape, a polygonal shape, or the like, as appropriate. The sealant 205 does not necessarily surround the driver circuit portion 204 as long as it surrounds at least the pixel portion 202. For example, the sealant 205 may be formed so as to surround part of the driver circuit portion 204; alternatively, the driver circuit portion 204 may be formed outside the frame of the sealant 205. The sealant 205 may be formed in the driver circuit portion 204 and thus a frame of the liquid crystal display device can be narrowed.

The sealant 205 is not necessarily formed over the first substrate 201 and may be formed over the second substrate 206. In the case where the sealant 205 is formed over the second substrate 206, the sealant 205 is formed so that the sealant 205 over the second substrate 206 surrounds at least the pixel portion 202 when the first substrate 201 and the second substrate 206 are attached to each other in a later step.

The sealant 205 is preferably formed using a material including an ultraviolet curable resin, and the material can be the same or substantially the same as the material described in Embodiment 1.

After the formation of the sealant 205, the sealant 205 may be temporarily cured by ultraviolet light irradiation. The ultraviolet light irradiation for temporarily curing the sealant 205 is performed with a low intensity for a short time as compared with ultraviolet light irradiation for curing (fully curing) the sealant in a later step. The ultraviolet curable resin of the surface of the sealant 205 can be hardened by temporarily curing the sealant 205; thus, when the liquid crystal layer 208 is in contact with the sealant 205 in a later step, an impurity can be prevented from mixing with the liquid crystal layer 208 from the sealant 205. Although the oxide semiconductor layers of the thin film transistor 211 and the thin film transistor 210 are damaged by the ultraviolet light irradiation for temporarily curing the sealant 205, such damage can be repaired by heat treatment performed in a later step.

Next, attachment of the first substrate and the second substrate (the step 123) will be described.

The first substrate 201 and the second substrate 206 are attached to each other under a reduced-pressure atmosphere in a manner similar to that of attachment of the first substrate and the second substrate (the step 104) in Embodiment 1.

Next, curing of the sealant by ultraviolet light irradiation (the step 124) will be described.

The first substrate 201 and the second substrate 206 are attached to each other in a manner similar to that of curing of the sealant by ultraviolet light irradiation (the step 105) in Embodiment 1, and then curing (fully curing) of the sealant 205 is performed by ultraviolet light irradiation. The ultraviolet light irradiation for fully curing the sealant 205 is performed with a high intensity for a long time as compared with ultraviolet light irradiation for temporarily curing the sealant in the above-described step. Accordingly, the ultraviolet curable resin inside the sealant 205 can be cured, which can increase adhesiveness between the first substrate 201 and the second substrate 206. The oxide semiconductor layers of the thin film transistors 210 and 211 are damaged when the sealant 205 is irradiated with ultraviolet light to be cured; however, heat treatment performed later can repair damage to the oxide semiconductor layer caused by ultraviolet light irradiation.

After the ultraviolet light irradiation of the sealant 205, heat treatment is preferably performed on the sealant 205. Accordingly, the sealant 205 can be cured more firmly. The heat treatment for curing the sealant 205 is preferably formed at a temperature of 80° C. to 200° C. for 0.5 hours to 10 hours. Heat treatment of the sealant after ultraviolet light irradiation is effective because a portion which is shaded and not irradiated with ultraviolet light in the ultraviolet light irradiation can be cured by the heat treatment.

In the case where a plurality of panels is taken out from a pair of substrates (obtaining a plurality of panels), the sealant 205 is cured and then, a pair of substrates which are attached is divided. At this time, the pair of substrates attached to each other is divided so that the opening formed in the sealant 205 is exposed. The pair of substrates which are attached can be divided using a cutting apparatus such as a scriber apparatus, a breaker apparatus, or a roll cutter.

Next, formation of the liquid crystal layer by injection (the step 125) will be described.

The liquid crystal layer 208 is formed in such a manner that liquid crystal is injected in a region surrounded by the sealant 205 formed over the first substrate 201 or the second substrate 206 by a liquid crystal injection method such as a vacuum injection method. For example, in the case of employing a vacuum injection method, the pair of substrates attached to each other is put in a vacuum chamber, and then liquid crystal is in contact with the opening formed in the sealant 205 of the pair of substrates attached to each other in a vacuum. After that, a gas is supplied to the vacuum chamber and the pressure in the vacuum chamber is increased; thus, liquid crystal is injected into the region surrounded by the sealant 205 through the opening. After the injection of liquid crystal, the opening of the sealant 205 is sealed with an ultraviolet curable resin or the like.

The liquid crystal layer 208 can be the same or substantially the same as the layer described in Embodiment 1.

The liquid crystal layer 208 is formed using liquid crystal including an ultraviolet curable resin in a manner similar to that in Embodiment 1 and the liquid crystal layer 208 may be applied to a liquid crystal display device having a display mode typified by a PDLC mode, a PNLC mode, or a blue phase mode.

A thin film transistor including an oxide semiconductor layer has the possibility that electrical characteristics of the thin film transistor may significantly change and deviate from the designed range by the influence of static electricity. Therefore, it is more effective to use a blue-phase liquid crystal material for a liquid crystal display device having a thin film transistor including an oxide semiconductor layer.

In the case where liquid crystal exhibiting a blue phase is employed as the liquid crystal layer 208, phase transition of the liquid crystal layer 208 from an isotropic phase to a blue phase and polymer stabilization treatment are performed. The phase transition of the liquid crystal layer 208 from an isotropic phase to a blue phase is performed as follows: heat treatment is performed at a temperature within +10° C., preferably +5° C. from the phase transition temperature between the blue phase and the isotropic phase, and then the temperature is gradually decreased. The phase transition temperature between the blue phase and the isotropic phase is a temperature at which the phase changes from the blue phase to the isotropic phase when the temperature rises, or a temperature at which the phase changes from the isotropic phase to the blue phase when the temperature decreases.

The polymer stabilization treatment can be performed in such a manner that a liquid crystal material including liquid crystal, a chiral agent, an ultraviolet curable resin, and a photopolymerization initiator is irradiated with light having a wavelength with which the ultraviolet curable resin and the photopolymerization initiator are reacted, in a state in which the blue phase is exhibited. The liquid crystal layer 208 is irradiated with ultraviolet light in a state where temperature at which a blue phase is exhibited is kept; thus, the polymer stabilization treatment can be performed. The oxide semiconductor layers of the thin film transistors 210 and 211 are damaged when the liquid crystal layer 208 is irradiated with ultraviolet light as the polymer stabilization treatment; however, heat treatment performed later can repair damage to the oxide semiconductor layer caused by ultraviolet light irradiation.

In the case where a polymer dispersed liquid crystal (PDLC) mode or a polymer network liquid crystal (PNLC) mode is used, ultraviolet light irradiation of the liquid crystal layer 208 is performed so that the liquid crystal layer 208 is cured and droplets are formed in the liquid crystal layer 208.

After the liquid crystal layer 208 is formed by a liquid crystal injection method, the orientation of the liquid crystal is disordered in some cases; thus, heat treatment for realigning the orientation of the liquid crystal layer 208 is preferably performed. Realignment of the liquid crystal layer 208 is performed in such a manner that heat treatment is performed at a temperature at which the liquid crystal layer 208 exhibits an isotropic phase or higher and the liquid crystal layer 208 is realigned when the temperature decreases. Heat treatment for realignment is preferably performed at a temperature of 80° C. to 200° C. for 10 minutes to 60 minutes, preferably at a temperature of 100° C. to 170° C. for 10 minutes to 60 minutes.

Lastly, heat treatment for repairing damage to the oxide semiconductor layer caused by the ultraviolet light irradiation (the step 126) will be described.

In order to suppress shift of the threshold voltage of the thin film transistor in the negative direction, after all the steps of ultraviolet light irradiation are completed in the process for manufacturing the liquid crystal display device, heat treatment for repairing damage to the oxide semiconductor layer caused by ultraviolet light irradiation is performed, in a manner similar to that of Embodiment 1.

The heat treatment for repairing damage to the oxide semiconductor layer is performed preferably at a temperature of 50° C. to 300° C. for 0.5 hours to 24 hours, further preferably at a temperature of 125° C. to 250° C. for 2 hours to 15 hours. In addition, the heat treatment is preferably performed under an air atmosphere, an oxygen atmosphere, a nitrogen atmosphere, or a rare gas (such as helium, neon, or argon) atmosphere. The heat treatment for repairing damage to the oxide semiconductor layer is preferably performed at a lower temperature for longer time as compared with the heat treatment for formation of the oxide semiconductor layer. A heating method using an electric furnace or the like can be employed for the heat treatment for repairing damage to the oxide semiconductor layer.

Realignment of atoms which exist in the oxide semiconductor layer or in the vicinity thereof is gradually carried out by the heat treatment. According to this, it is possible to repair dangling bonds formed by ultraviolet light irradiation in the oxide semiconductor layer, at the interface between the oxide semiconductor layer and the gate insulating layer, or at the interface between the oxide semiconductor layer and the insulating layer 220.

Damage to the oxide semiconductor layer by ultraviolet light can be repaired, so that a decrease in electric characteristics of the thin film transistor including the oxide semiconductor layer can be prevented and the shift of the threshold voltage in the negative direction can be suppressed.

In addition, even when the threshold voltage varies among thin film transistors formed over one substrate by ultraviolet light irradiation, the above-described heat treatment can reduce the variation in the threshold voltage.

The channel length of the thin film transistor is shortened, so that high speed operation and low power consumption of the liquid crystal display device can be achieved.

The heat treatment for repairing damage to the oxide semiconductor layer can also serve as the heat treatment for realignment.

As described above, the liquid crystal display device is manufactured by the method described in this embodiment, so that damage to an oxide semiconductor layer caused by ultraviolet light irradiation can be repaired. According to this, even when the oxide semiconductor layer of the thin film transistor included in the liquid crystal display device is damaged by ultraviolet light in the process for manufacturing the liquid crystal display device, shift of the threshold voltage of the thin film transistor in the negative direction due to the damage by ultraviolet light irradiation can be suppressed.

Moreover, the thin film transistor that functions as a switching element in the display device can be normally off, so that the liquid crystal display device having low power consumption and high reliability can be manufactured.

Embodiment 3

In this embodiment, a method for manufacturing a light-emitting display device illustrated in FIG. 5, in which a thin film transistor including an oxide semiconductor layer is used, will be described with reference to a flow chart of FIG. 4.

In this embodiment, as a display element included in a display device, a light-emitting element utilizing electroluminescence is used. Light-emitting elements utilizing electroluminescence are classified according to whether a light-emitting material is an organic compound or an inorganic compound. In general, the former is referred to as an organic EL element, and the latter is referred to as an inorganic EL element.

In an organic EL element, by application of voltage to a light-emitting element, electrons and holes are separately injected from a pair of electrodes into a layer containing a light-emitting organic compound, and current flows. The carriers (electrons and holes) are recombined, and thus, the light-emitting organic compound is excited. The light-emitting organic compound returns to a ground state from the excited state, thereby emitting light. Owing to such a mechanism, this light-emitting element is referred to as a current-excitation light-emitting element.

The inorganic EL elements are classified according to their element structures into a dispersion-type inorganic EL element and a thin-film inorganic EL element. A dispersion-type inorganic EL element has a light-emitting layer where particles of a light-emitting material are dispersed in a binder, and its light emission mechanism is donor-acceptor recombination type light emission that utilizes a donor level and an acceptor level. A thin-film inorganic EL element has a structure where a light-emitting layer is sandwiched between dielectric layers, which are further sandwiched between electrodes, and its light emission mechanism is localized type light emission that utilizes inner-shell electron transition of metal ions. Note that in this embodiment, description is made using an organic EL element as a light-emitting element.

A structure of a light-emitting display device illustrated in FIG. 5 will be described. In the light-emitting display device, a thin film transistor 310, a thin film transistor 311, and a light-emitting element 313 which are formed over a first substrate 301 are sealed between the first substrate 301 and a second substrate 306 with a sealant 305. A space between the thin film transistor 310, the thin film transistor 311, and the light-emitting element 313 and the second substrate 306 is filled with a filler to form a filler material layer 308. It is preferable that the light-emitting element 313 be thus packaged (sealed) with a protective film (such as an attachment film or an ultraviolet curable resin film) or a cover material with high air-tightness and little degasification so that the light-emitting element 313 is not exposed to the outside air.

Figure 5:
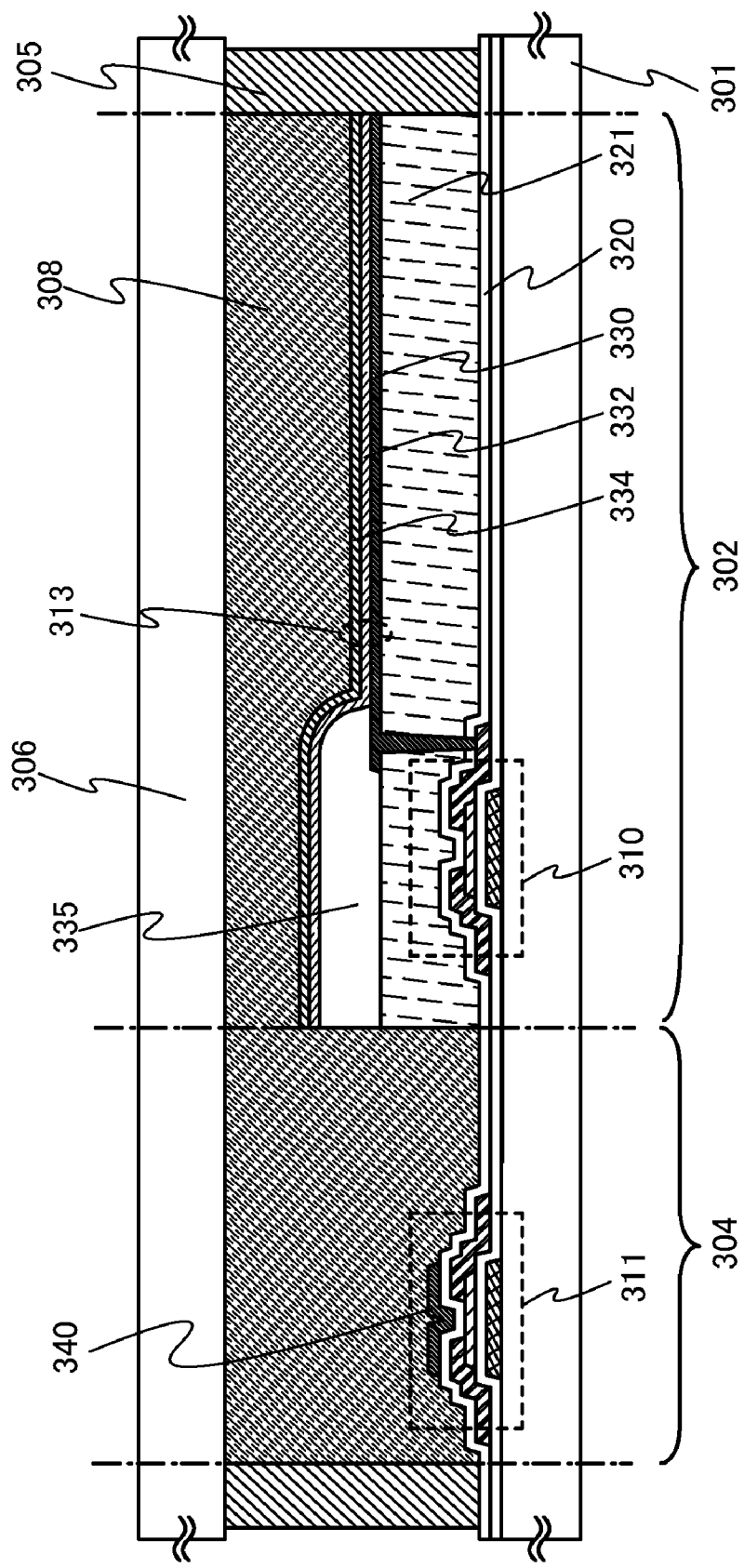
FIG. 5 is a cross-sectional view of a display device according to one embodiment of the present invention.

The light-emitting display device illustrated in FIG. 5 has the following structure on the active matrix substrate side. Over the first substrate 301, a thin film transistor 310 including an oxide semiconductor layer is formed in a pixel portion 302 and a thin film transistor 311 including an oxide semiconductor layer is formed in a driver circuit portion 304. An insulating layer 320 and an insulating layer 321 are formed over the thin film transistor 310 in the pixel portion 302, a first electrode layer 330 electrically connected to one of a source electrode layer and a drain electrode layer of the thin film transistor is formed over the insulating layer 321, and a partition 335 is formed over the first electrode layer 330 and the insulating layer 321. An electroluminescent layer 332 is formed over the partition 335 and the first electrode layer 330, and a second electrode layer 334 is formed over the electroluminescent layer 332. The light-emitting element 313 is formed by stacking the first electrode layer 330, the electroluminescent layer 332, and the second electrode layer 334. Note that the structure of the light-emitting element 313 is not limited thereto. The structure of the light-emitting element 313 can be changed as appropriate depending on the direction in which light is extracted from the light-emitting element 313, or the like. Further, a conductive layer 340 is formed over the thin film transistor 311 in the driver circuit portion 304.

Note that in this embodiment, the driver circuit portion 304 is formed inside the frame of the sealant 305; however, the driver circuit portion 304 is not necessarily formed in such a manner, and the entire or part of the driver circuit portion 304 may be formed outside the frame of the sealant 305. In the case of forming the driver circuit portion outside the frame of the sealant 305, the driver circuit portion may be formed over another substrate, and then mounted by a COG method, a wire bonding method, a TAB method or the like. For example, a scan line driver circuit portion may be formed with a pixel portion inside the frame of the sealant over one substrate and a signal line driver circuit portion may be formed over another substrate, and then mounted over the active matrix substrate.

Next, in accordance with the flow chart of FIG. 4, a method for manufacturing the light-emitting display device illustrated in FIG. 5 will be described.

Figure 4:
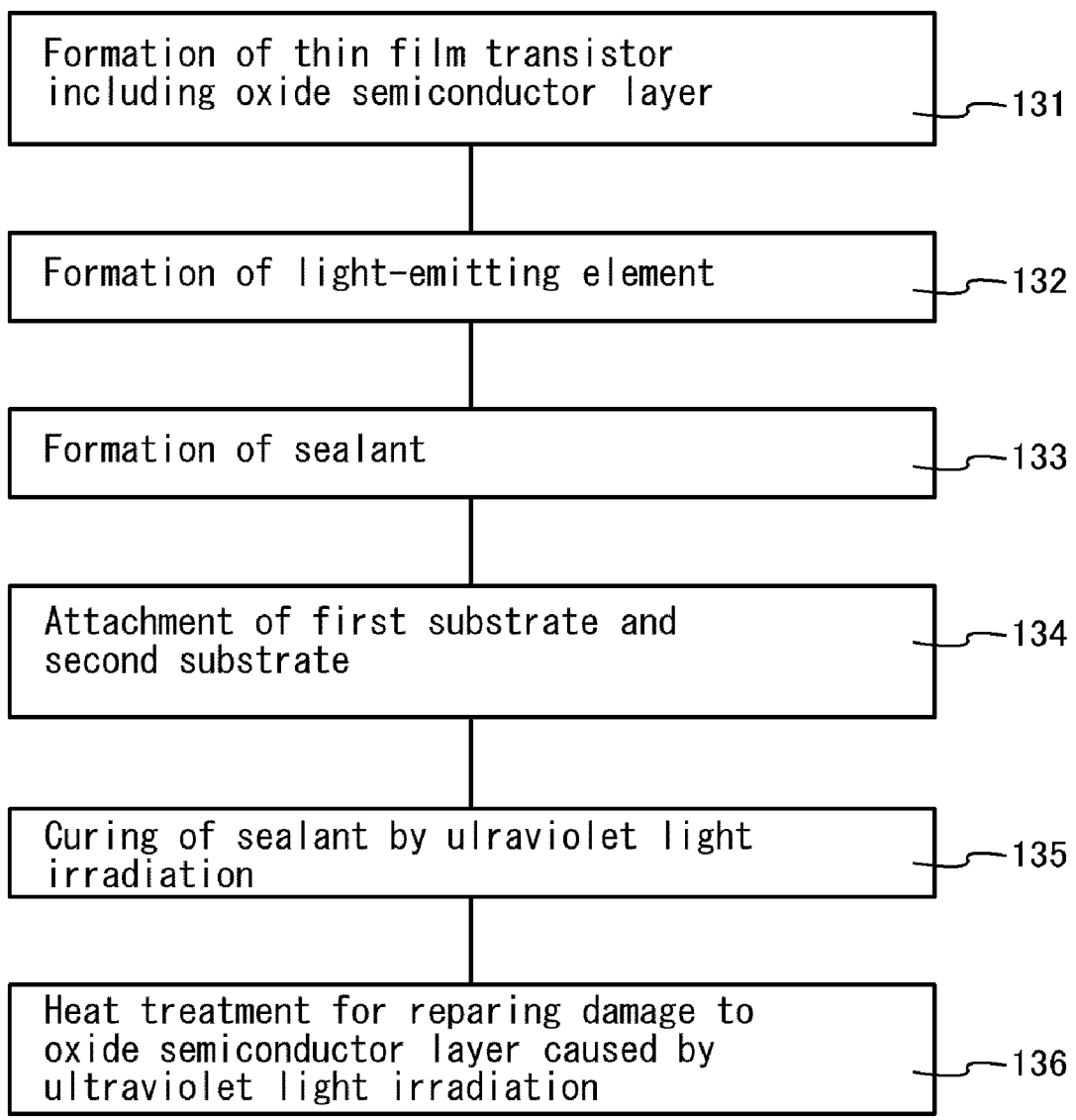
FIG. 4 is a flow chart of a method for manufacturing a display device according to one embodiment of the present invention.

In this embodiment, in accordance with the flow chart of FIG. 4, formation of a thin film transistor including an oxide semiconductor layer (a step 131), formation of a light-emitting element (a step 132), formation of a sealant (a step 133), attachment of a first substrate and a second substrate (a step 134), curing of the sealant by ultraviolet light irradiation (a step 135), and heat treatment for repairing damage to the oxide semiconductor layer caused by the ultraviolet light irradiation (a step 136) will be described in this order.

Formation of the thin film transistor including an oxide semiconductor layer (the step 131) is the same or substantially the same as the formation of the thin film transistor including an oxide semiconductor layer (the step 101) described in Embodiment 1; therefore, Embodiment 1 is to be referred to. Materials and methods for manufacturing the first substrate 301, the second substrate 306, the thin film transistor 310, the thin film transistor 311, the conductive layer 340, the insulating layer 320, and the insulating layer 321 are the same or substantially the same as the materials and methods for manufacturing the first substrate 201, the second substrate 206, the thin film transistor 210, the thin film transistor 211, the conductive layer 240, the insulating layer 220, and the insulating layer 221 described in Embodiment 1, respectively; therefore, Embodiment 1 is to be referred to.

Next, formation of the light-emitting element (the step 132) will be described. An opening is formed by etching the insulating layer 321 so as to reach one of the source electrode and the drain electrode of the thin film transistor 310. After that, the first electrode layer 330 is formed; the partition 335 is formed to have an opening over the first electrode layer 330; and the electroluminescent layer 332 and the second electrode layer 334 are formed over the partition 335 and the first electrode layer 330. Accordingly, the light-emitting element 313 formed by stacking the first electrode layer 330, the electroluminescent layer 332, and the second electrode layer 334 can be formed. Described below is combination of materials for the first electrode layer 330 that serves as a cathode and a second electrode layer 334 that serves as an anode in the case of the top-emission structure in which light is emitted from the light-emitting element 313 to the second electrode layer 334.

The first electrode layer 330 that functions as a cathode can be formed using a variety of materials, and a material having a low work function, for example, an alkali metal such as Li or Cs, an alkaline earth metal such as Mg, Ca, or Sr, an alloy including any of these (such as Mg:Ag or Al:Li), a rare earth metal such as Yb or Er, or the like is preferably used.

The partition 335 for insulating the first electrode layer 330 of an adjacent pixel is formed using an organic resin film such as polyimide, acrylic, polyamide, or epoxy; an inorganic insulating film; or organic polysiloxane. It is particularly preferable that the partition 335 be formed using a photosensitive resin material to have an opening over the first electrode layer 330 so that a sidewall of the opening is formed as a tilted surface with continuous curvature. In the case of using a photosensitive resin material for the partition 335, a step of forming a resist mask can be omitted. The oxide semiconductor layer of the thin film transistor 310 is damaged when the partition 335 is irradiated with ultraviolet light; however, heat treatment performed later can repair damage to the oxide semiconductor layer caused by ultraviolet light irradiation.

The electroluminescent layer 332 may be formed using a single layer or a plurality of layers stacked. In the case where the electroluminescent layer 332 is formed using a plurality of layers, an electron-injection layer, an electron-transport layer, a light-emitting layer, a hole-transport layer, and a hole-injection layer are stacked in this order over the first electrode layer 330 that functions as a cathode. It is not necessary to form all of these layers.

The second electrode layer 334 that functions as an anode is formed using a light-transmitting conductive material. For example, a light-transmitting conductive film of indium oxide including tungsten oxide, indium zinc oxide including tungsten oxide, indium oxide including titanium oxide, indium tin oxide including titanium oxide, indium tin oxide, indium zinc oxide, or indium tin oxide to which silicon oxide is added may be used.

In the case of a bottom-emission structure in which light is emitted from the light-emitting element 313 to the first electrode layer 330 or a dual-emission structure in which light is emitted from the light-emitting element 313 to the first electrode layer 330 and the second electrode layer 334, a structure such that emission from the light-emitting element 313 is not prevented; for example, a reflective conductive film may be provided or materials may be exchanged between the electrode layers as appropriate.

Next, formation of the sealant (the step 133) will be described.

The sealant 305 is formed by a screen printing method, or using an ink-jet apparatus or a dispensing apparatus so as to surround the pixel portion 302 and the driver circuit portion 304 (closed-loop shape) over the first substrate 301. The sealant may be formed to have a rectangular shape, a circular shape, an elliptical shape, a polygonal shape, or the like, as appropriate. The sealant 305 does not necessarily surround the driver circuit portion 304 as long as it surrounds at least the pixel portion 302. For example, the sealant 305 may be formed so as to surround part of the driver circuit portion 304; alternatively, the driver circuit portion 304 may be formed outside the frame of the sealant 305. The sealant 305 may be formed in the driver circuit portion 304 and thus a frame of the light-emitting display device can be narrowed.

The sealant 305 is not necessarily formed over the first substrate 301 and may be formed over the second substrate 306. In the case where the sealant 305 is formed over the second substrate 306, the sealant 305 is formed so that the sealant 305 over the second substrate 306 surrounds at least the pixel portion 302 when the first substrate 301 and the second substrate 306 are attached to each other in a later step.

The sealant 305 is preferably formed using a material including an ultraviolet curable resin. As the ultraviolet curable resin, a resin in which an acrylic-based resin and an epoxy-based resin are mixed can be used. Further, a UV initiator, a thermosetting agent, a coupling agent, or the like may be mixed into the resin. Furthermore, a filler (1 µm to 24 µm in diameter) may be contained.

The sealant 305 is formed, and then the sealant 305 may be irradiated with ultraviolet light to be temporarily cured. The ultraviolet light irradiation for temporarily curing the sealant 305 is performed with a low intensity for a short time as compared with ultraviolet light irradiation for curing (fully curing) the sealant in a later step. The oxide semiconductor layers of thin film transistors 310 and 311 are damaged when the sealant 305 is irradiated with ultraviolet light to be temporarily cured; however, heat treatment performed later can repair damage to the oxide semiconductor layer caused by ultraviolet light irradiation.

In the case where a space between the active matrix substrate and the second substrate 306 is filled with the filler, the filling may be performed after the formation of the sealant 305. The filler material layer 308 is formed by dropping the filler in a region surrounded by the sealant 305 formed over the first substrate 301 or the second substrate 306 by a droplet discharging method such as a dispensing method or an ink-jet method. As the filler, an ultraviolet curable resin or a thermosetting resin can be used; for example, polyvinyl chloride (PVC), acrylic, polyimide, an epoxy resin, a silicone resin, polyvinyl butyral (PVB), or ethylene vinyl acetate (EVA) can be used. In the case of using an ultraviolet curable resin as the filler, the sealant 305 is not necessarily used because the first substrate 301 and the second substrate 306 can be in close contact with each other using the filler material layer 308.

In the case of using an ultraviolet curable resin as the filler, the oxide semiconductor layers of thin film transistors 310 and 311 are damaged by ultraviolet light irradiation for curing; however, heat treatment performed later can repair damage to the oxide semiconductor layer caused by ultraviolet light irradiation.

Alternatively, as the filler, a space between the active matrix substrate and the second substrate 306 may be filled with an inert gas such as nitrogen or argon.

Next, attachment of the first substrate and the second substrate (the step 134) will be described.

The sealant 305 is formed so as to surround the pixel portion 302 and the driver circuit portion 304 (closed-loop shape), and then the first substrate 301 and the second substrate 306 are attached to each other. Note that in the case where the sealant 305 and the filler material layer 308 are formed over the second substrate 306, it is necessary that at least the pixel portion 302 of the first substrate 301 overlap with the filler material layer 308.

Alternatively, after the first substrate 301 and the second substrate 306 are attached to each other, the filler material layer 308 may be formed. In that case, an opening is formed in the sealant 305 when the sealant 305 is formed, and a space between the active matrix substrate and the second substrate 306 is filled with the filler by a vacuum injection method or the like.

Next, curing of the sealant by ultraviolet light irradiation (the step 135) will be described.

The first substrate 301 and the second substrate 306 are attached to each other, and then curing (fully curing) of the sealant 305 is performed by ultraviolet light irradiation. The ultraviolet light irradiation for fully curing the sealant 305 is performed with a high intensity for a long time as compared with ultraviolet light irradiation for temporarily curing the sealant in the above-described step. Accordingly, the ultraviolet curable resin inside the sealant 305 can be cured, which can increase adhesiveness between the first substrate 301 and the second substrate 306. The oxide semiconductor layers of the thin film transistors 310 and 311 are damaged when the sealant 305 is irradiated with ultraviolet light to be cured; however, heat treatment performed later can repair damage to the oxide semiconductor layer caused by ultraviolet light irradiation.

After the ultraviolet light irradiation of the sealant 305, heat treatment is preferably performed on the sealant 305. Accordingly, the sealant 305 can be cured more firmly. The heat treatment for curing the sealant 305 is preferably formed at a temperature of 80° C. to 200° C. for 0.5 hours to 10 hours. Heat treatment of the sealant after ultraviolet light irradiation is effective because a portion which is shaded and not irradiated with ultraviolet light in the ultraviolet light irradiation can be cured by the heat treatment.

In the case of using an ultraviolet curable resin as the filler, the filler can be cured together with the sealant 305.

In the case where a plurality of panels is taken out from a pair of substrates (obtaining a plurality of panels), the sealant 305 is cured and then, a pair of substrates which are attached is divided. The pair of substrates which are attached can be divided using a cutting apparatus such as a scriber apparatus, a breaker apparatus, or a roll cutter.

Lastly, heat treatment for repairing damage to the oxide semiconductor layer caused by the ultraviolet light irradiation (the step 136) will be described.

In order to suppress shift of the threshold voltage of the thin film transistor in the negative direction, after all the steps of ultraviolet light irradiation are completed in the process for manufacturing the light-emitting display device, heat treatment for repairing damage to the oxide semiconductor layer caused by ultraviolet light irradiation is performed in a manner similar to that in Embodiment 1 or Embodiment 2.

The heat treatment for repairing damage to the oxide semiconductor layer is performed preferably at a temperature of 50° C. to 300° C. for 0.5 hours to 24 hours, further preferably at a temperature of 125° C. to 250° C. for 1 hour to 15 hours. In addition, the heat treatment is preferably performed under an air atmosphere, an oxygen atmosphere, a nitrogen atmosphere, or a rare gas (such as helium, neon, or argon) atmosphere. The temperature of the heat treatment for repairing damage to the oxide semiconductor layer is preferably lower than that of the heat treatment for dehydration or dehydrogenation of the oxide semiconductor layer. A heating method using an electric furnace or the like can be employed for the heat treatment for repairing damage to the oxide semiconductor layer.

Realignment of atoms which exist in the oxide semiconductor layer or in the vicinity thereof is gradually carried out by the heat treatment. According to this, it is possible to repair dangling bonds formed by ultraviolet light irradiation in the oxide semiconductor layer, at the interface between the oxide semiconductor layer and the gate insulating layer, or at the interface between the oxide semiconductor layer and the insulating layer 320.

Damage to the oxide semiconductor layer by ultraviolet light can be repaired, so that a decrease in electric characteristics of the thin film transistor including the oxide semiconductor layer can be prevented and the shift of the threshold voltage in the negative direction can be suppressed.

In addition, even when the threshold voltage varies among thin film transistors formed over one substrate by ultraviolet light irradiation, the above-described heat treatment can reduce the variation in the threshold voltage.

The channel length of the thin film transistor is shortened, so that high speed operation and low power consumption of the light-emitting display device can be achieved.

The heat treatment for repairing damage to the oxide semiconductor layer can also serve as heat treatment for curing the sealant 305 which is performed after ultraviolet light irradiation of the sealant 305.

As described above, the light-emitting display device is manufactured by the method described in this embodiment, so that damage to an oxide semiconductor layer caused by ultraviolet light irradiation can be repaired. According to this, even when the oxide semiconductor layer of the thin film transistor included in the light-emitting display device is damaged by ultraviolet light in the process for manufacturing the light-emitting display device, shift of the threshold voltage of the thin film transistor in the negative direction due to the damage by ultraviolet light irradiation can be suppressed.

Moreover, the thin film transistor that functions as a switching element in the display device can be normally off, so that the light-emitting display device having low power consumption and high reliability can be manufactured.

Embodiment 4

In this embodiment, a method for manufacturing an electrophoretic display device illustrated in FIG. 7, in which a thin film transistor including an oxide semiconductor layer is used, will be described with reference to a flow chart of FIG. 6.

The method for manufacturing the display device described in Embodiment 1 may be used for an electrophoretic display device in which electronic ink is driven by utilizing an element electrically connected to a switching element. The electrophoretic display device is also called an electrophoretic display and has advantages that it has the same level of readability as paper, and it consumes less power and is thinner and lighter than other display devices.

There are a variety of modes of electrophoretic displays. The electrophoretic display is a device in which a plurality of microcapsules each including first particles having positive charge and second particles having negative charge are dispersed in a solvent or a solute, and an electrical field is applied to the microcapsules so that the particles in the microcapsules move in opposite directions from each other, and only a color of the particles gathered on one side is displayed. Note that the first particles or the second particles include a colorant, and does not move when there is not electric field. A color of the first particles is different from a color of the second particles (the particles may also be colorless).

Thus, the electrophoretic display utilizes a so-called dielectrophoretic effect, in which a substance with high dielectric constant moves to a region with high electric field.

A substance in which the microcapsules are dispersed in a solvent is called electronic ink, and this electronic ink can be printed on a surface of glass, plastic, fabric, paper, or the like. Color display is also possible with the use of a color filter or particles including a coloring matter.

In addition, an active matrix display device can be completed by providing as appropriate, a plurality of the microcapsules over an active matrix substrate so as to be interposed between two electrodes, and can perform display by application of electric field to the microcapsules.

Note that the first particles and the second particles in the microcapsule may be formed from one of a conductive material, an insulating material, a semiconductor material, a magnetic material, a liquid crystal material, a ferroelectric material, an electroluminescent material, an electrochromic material, and a magnetophoretic material or a composite material thereof.

Figure 7:
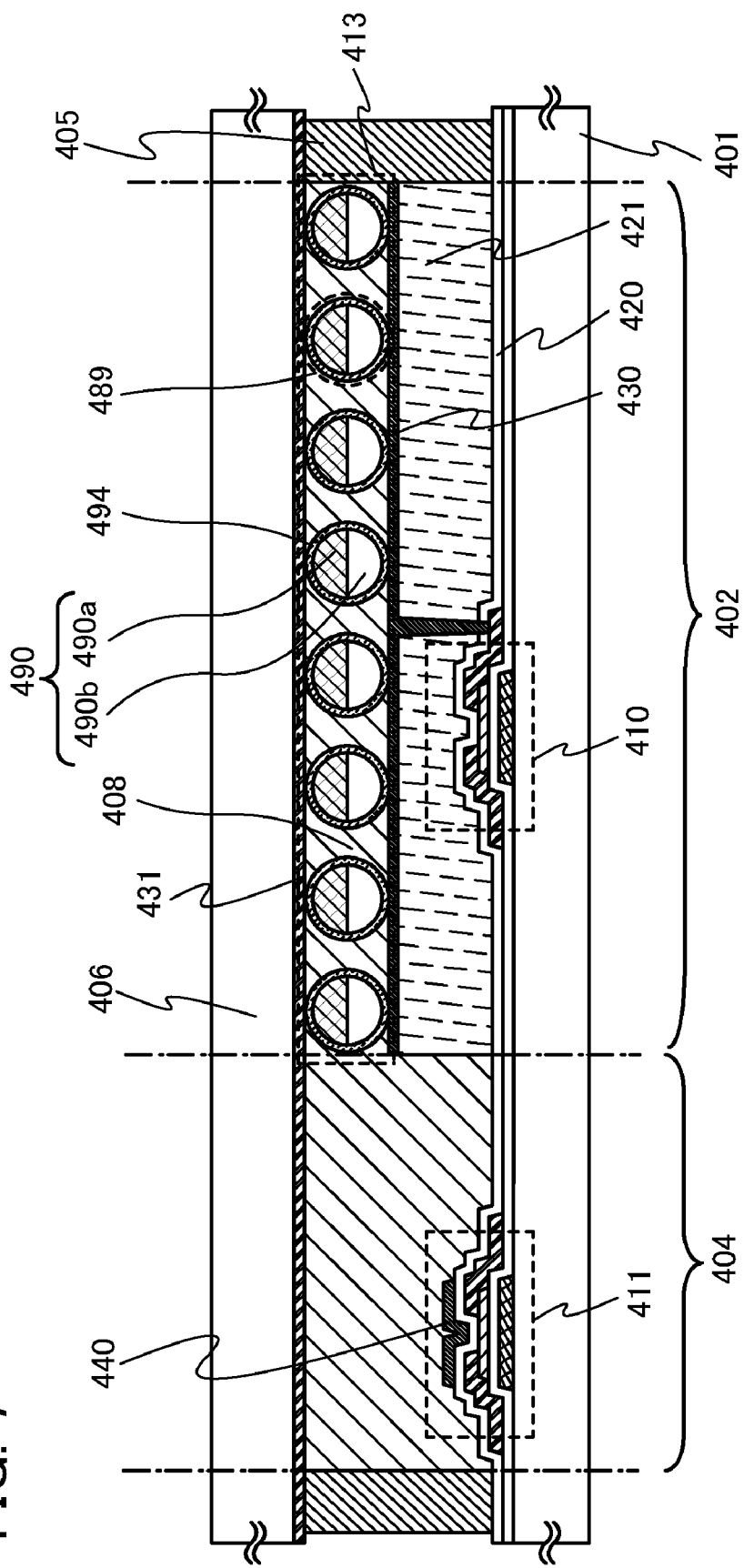
FIG. 7 is a cross-sectional view of a display device according to one embodiment of the present invention.

The electrophoretic display device illustrated in FIG. 7 is an example of an electrophoretic display device using a twisting ball display system. The twisting ball display system refers to a method in which spherical particles each colored in black and white are arranged between a first electrode layer and a second electrode layer which are electrode layers used for a display element, and a potential difference is generated between the first electrode layer and the second electrode layer to control orientation of the spherical particles, so that display is performed.

The display system of an electrophoretic display device is not limited thereto; microcapsule electrophoresis system, Microcup (registered trademark) electrophoresis system, the horizontal electrophoresis system, the vertical electrophoresis system, a particle-moving system, Electronic Liquid Powder (registered trademark) system, a system using cholesteric liquid crystal, a system using chiral nematic liquid crystal, a system using anti-ferroelectric liquid crystal, a system using polymer dispersed liquid crystal, a system using a charged toner, an electrowetting system, an electrochromism system, an electrodeposition system, or the like may be employed.

A structure of the electrophoretic display device illustrated in FIG. 7 will be described. In the electrophoretic display device, an electrophoretic display element layer 413 is sandwiched between an active matrix substrate formed of a first substrate 401 and a second substrate 406. Further, a sealant 405 is formed so as to surround a pixel portion 402 and a driver circuit portion 404 between the first substrate 401 and the second substrate 406.

The electrophoretic display device illustrated in FIG. 7 has the following structure on the active matrix substrate side. Over the first substrate 401, a thin film transistor 410 including an oxide semiconductor layer is formed in a pixel portion 402 and a thin film transistor 411 including an oxide semiconductor layer is formed in a driver circuit portion 404. An insulating layer 420 and an insulating layer 421 are formed over the thin film transistor 410 in the pixel portion 402, and a first electrode layer 430 electrically connected to one of a source electrode layer and a drain electrode layer of the thin film transistor is formed over the insulating layer 421. Here, the first electrode layer 430 corresponds to a pixel electrode. Further, a conductive layer 440 is formed over the thin film transistor 411 in the driver circuit portion 404.

In the electrophoretic display device illustrated in FIG. 7, a second electrode layer 431 is formed over the second substrate 406.

The electrophoretic display element layer 413 sandwiched between the first electrode layer 430 and the second electrode layer 431 includes a filler material layer 408 and a twisting ball 489. The twisting ball 489 includes a spherical particle 490 and a cavity 494 filled with liquid around the spherical particle 490. The spherical particle 490 includes a black region 490a and a white region 490b. The charge density of the black region 490a differs from that of the white region 490b. Accordingly, a potential difference is generated between the first electrode layer 430 and the second electrode layer 431 so that the spherical particle 490 can be rotated depending on an electric field direction.

Note that in this embodiment, the driver circuit portion 404 is formed inside the frame of the sealant 405; however, the driver circuit portion 404 is not necessarily formed in such a manner, and the entire or part of the driver circuit portion 404 may be formed outside the frame of the sealant 405. In the case of forming the driver circuit portion outside the frame of the sealant 405, the driver circuit portion may be formed over another substrate, and then mounted by a COG method, a wire bonding method, a TAB method or the like. For example, a scan line driver circuit portion may be formed with a pixel portion inside the frame of the sealant over one substrate and a signal line driver circuit portion may be formed over another substrate, and then mounted over the active matrix substrate.

Next, in accordance with the flow chart of FIG. 6, a method for manufacturing the electrophoretic display device illustrated in FIG. 7 will be described.

Figure 6:
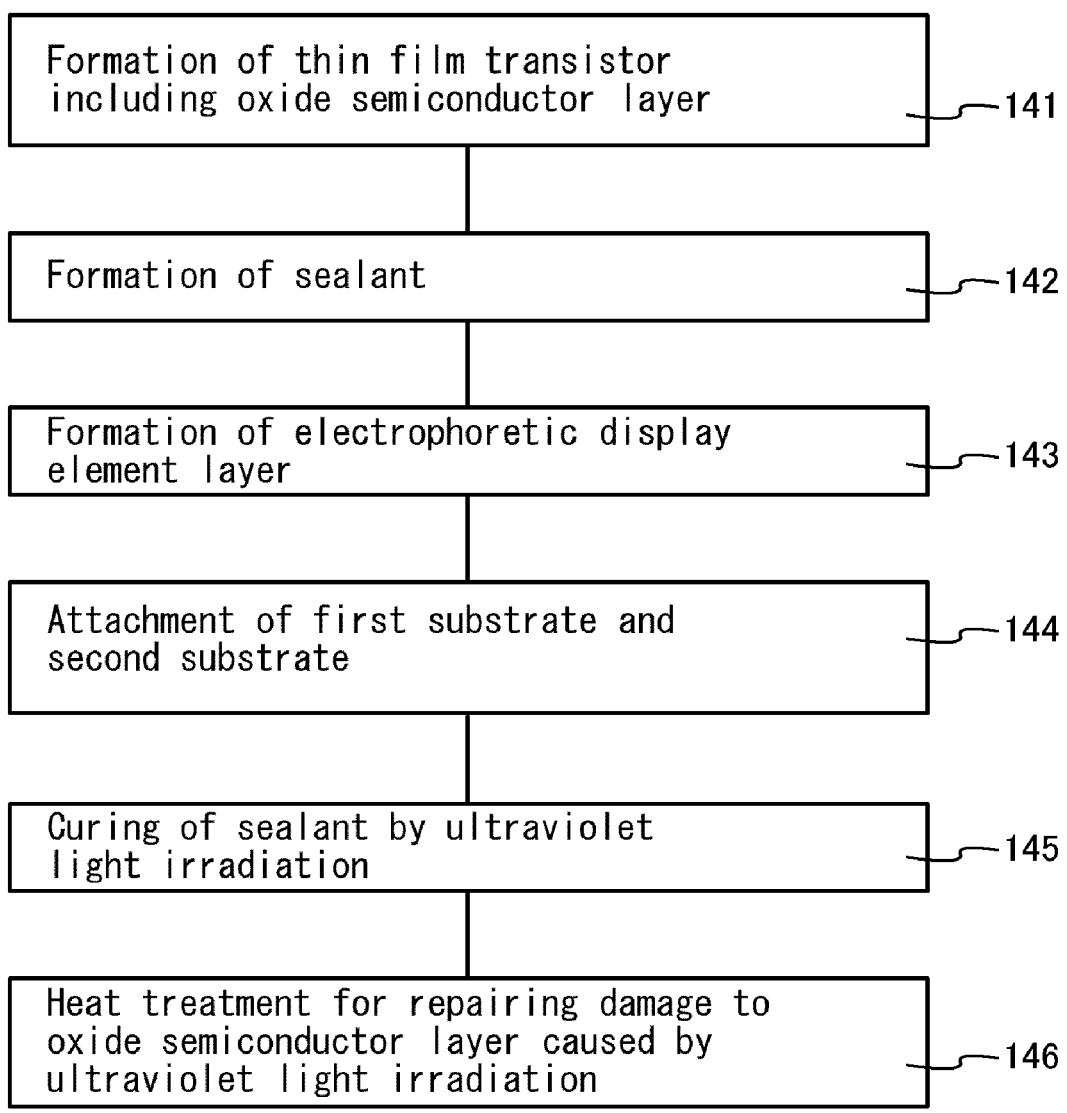
FIG. 6 is a flow chart of a method for manufacturing a display device according to one embodiment of the present invention.

In this embodiment, in accordance with the flow chart of FIG. 6, formation of a thin film transistor including an oxide semiconductor layer (a step 141), formation of a sealant (a step 142), formation of an electrophoretic display element layer (a step 143), attachment of a first substrate and a second substrate (a step 144), curing of the sealant by ultraviolet light irradiation (a step 145), and heat treatment for repairing damage to the oxide semiconductor layer caused by the ultraviolet light irradiation (a step 146) will be described in this order.

Formation of the thin film transistor including an oxide semiconductor layer (the step 141) is the same or substantially the same as the formation of the thin film transistor including an oxide semiconductor layer (the step 101) described in Embodiment 1; therefore, Embodiment 1 is to be referred to. Materials and methods for manufacturing the first substrate 401, the thin film transistor 410, the thin film transistor 411, the insulating layer 420, the insulating layer 421, the first electrode layer 430, the conductive layer 440, the second substrate 406, and the second electrode layer 431 are the same or substantially the same as the materials and methods for manufacturing the first substrate 201, the thin film transistor 210, the thin film transistor 211, the insulating layer 220, the insulating layer 221, the pixel electrode layer 230, the conductive layer 240, the second substrate 206, and the counter electrode layer 231 described in Embodiment 1, respectively; therefore, Embodiment 1 is to be referred to.

Next, formation of the sealant (the step 142) will be described.

The sealant 405 is formed by a screen printing method, or using an ink-jet apparatus or a dispensing apparatus so as to surround the pixel portion 402 and the driver circuit portion 404 (closed-loop shape) over the first substrate 401. The sealant may be formed to have a rectangular shape, a circular shape, an elliptical shape, a polygonal shape, or the like, as appropriate. The sealant 405 does not necessarily surround the driver circuit portion 404 as long as it surrounds at least the pixel portion 402. For example, the sealant 405 may be formed so as to surround part of the driver circuit portion 404; alternatively, the driver circuit portion 404 may be formed outside the frame of the sealant 405. The sealant 405 may be formed in the driver circuit portion 404 and thus a frame of the electrophoretic display device can be narrowed.

The sealant 405 is not necessarily formed over the first substrate 401 and may be formed over the second substrate 406. In the case where the sealant 405 is formed over the second substrate 406, the sealant 405 is formed so that the sealant 405 over the second substrate 406 surrounds at least the pixel portion 402 when the first substrate 401 and the second substrate 406 are attached to each other in a later step.

The sealant 405 is preferably formed using a material including an ultraviolet curable resin. As the ultraviolet curable resin, a resin in which an acrylic-based resin and an epoxy-based resin are mixed can be used. Further, a UV initiator, a thermosetting agent, a coupling agent, or the like may be mixed into the resin. Furthermore, a filler (1 μm to 24 μm in diameter) may be contained.

After the formation of the sealant 405, the sealant 405 may be temporarily cured by ultraviolet light irradiation. The ultraviolet light irradiation for temporarily curing the sealant 405 is performed with a low intensity for a short time as compared with ultraviolet light irradiation for curing (fully curing) the sealant in a later step. Although the oxide semiconductor layers of the thin film transistor 411 and the thin film transistor 410 are damaged by the ultraviolet light irradiation for temporarily curing the sealant 405, such damage can be repaired by heat treatment performed in a later step.

Next, formation of the electrophoretic display element layer (the step 143) will be described.

The twisting ball 489 is disposed over the first electrode layer 430, and the filler is dropped in a region surrounded by the sealant 405 formed over the first substrate 401 or the second substrate 406 by a droplet discharging method such as a dispensing method or an ink-jet method, so that the electrophoretic display element layer 413 is formed. At this time, an appropriate amount of liquid crystal may be dropped in appropriate places in the region surrounded by the sealant 405.

Alternatively, the twisting ball 489 may be contained in the filler material layer 408 in advance, and the electrophoretic display element layer 413 may be formed by a droplet discharging method such as a dispensing method or an ink-jet method.

As the filler, an ultraviolet curable resin or a thermosetting resin can be used; for example, polyvinyl chloride (PVC), acrylic, polyimide, an epoxy resin, a silicone resin, polyvinyl butyral (PVB), or ethylene vinyl acetate (EVA) can be used. In the case of using an ultraviolet curable resin as the filler, the sealant 405 is not necessarily used because the first substrate 401 and the second substrate 406 can be in close contact with each other using the filler material layer 408.

In the case of using an ultraviolet curable resin as the filler, the oxide semiconductor layers of thin film transistors 410 and 411 are damaged by ultraviolet light irradiation for curing; however, heat treatment performed later can repair damage to the oxide semiconductor layer caused by ultraviolet light irradiation.

Next, attachment of the first substrate and the second substrate (the step 144) will be described.

The sealant 405 is formed so as to surround the pixel portion 402 and the driver circuit portion 404 (closed-loop shape), and then the first substrate 401 and the second substrate 406 are attached to each other. Note that in the case where the sealant 405 and the filler material layer 408 are formed over the second substrate 406, it is necessary that at least the pixel portion 402 of the first substrate 401 overlap with the filler material layer 408.

Alternatively, after the first substrate 401 and the second substrate 406 are attached to each other, the filler material layer 408 may be formed. In that case, an opening is formed in the sealant 405 when the sealant 405 is formed, and a space between the active matrix substrate and the second substrate 406 is filled with the filler by a vacuum injection method or the like.

Next, curing of the sealant by ultraviolet light irradiation (the step 145) will be described.

The first substrate 401 and the second substrate 406 are attached to each other, and then curing (fully curing) of the sealant 405 is performed by ultraviolet light irradiation. The ultraviolet light irradiation for fully curing the sealant 405 is performed with a high intensity for a long time as compared with ultraviolet light irradiation for temporarily curing the sealant in the above-described step. Accordingly, the ultraviolet curable resin inside the sealant 405 can be cured, which can increase adhesiveness between the first substrate 401 and the second substrate 406. The oxide semiconductor layers of the thin film transistors 410 and 411 are damaged when the sealant 405 is irradiated with ultraviolet light to be cured; however, heat treatment performed later can repair damage to the oxide semiconductor layer caused by ultraviolet light irradiation.

After the ultraviolet light irradiation of the sealant 405, heat treatment is preferably performed on the sealant 405. Accordingly, the sealant 405 can be cured more firmly. The heat treatment for curing the sealant 405 is preferably formed at a temperature of 80° C. to 200° C. for 0.5 hours to 10 hours. Heat treatment of the sealant after ultraviolet light irradiation is effective because a portion which is shaded and not irradiated with ultraviolet light in the ultraviolet light irradiation can be cured by the heat treatment.

In the case of using an ultraviolet curable resin as the filler, the filler can be cured together with the sealant 405.

In the case where a plurality of panels is taken out from a pair of substrates (obtaining a plurality of panels), the sealant 405 is cured and then, a pair of substrates which are attached is divided. The pair of substrates which are attached can be divided using a cutting apparatus such as a scriber apparatus, a breaker apparatus, or a roll cutter.

Lastly, heat treatment for repairing damage to the oxide semiconductor layer caused by the ultraviolet light irradiation (the step 146) will be described.

In order to suppress shift of the threshold voltage of the thin film transistor in the negative direction, after all the steps of ultraviolet light irradiation are completed in the process for manufacturing the electrophoretic display device, heat treatment for repairing damage to the oxide semiconductor layer caused by ultraviolet light irradiation is performed in a manner similar to that in Embodiments 1 to 3.

The heat treatment for repairing damage to the oxide semiconductor layer is performed preferably at a temperature of 50° C. to 300° C. for 0.5 hours to 24 hours, further preferably at a temperature of 125° C. to 250° C. for 1 hour to 15 hours. In addition, the heat treatment is preferably performed under an air atmosphere, an oxygen atmosphere, a nitrogen atmosphere, or a rare gas (such as helium, neon, or argon) atmosphere. The temperature of the heat treatment for repairing damage to the oxide semiconductor layer is preferably lower than that of the heat treatment for dehydration or dehydrogenation of the oxide semiconductor layer. A heating method using an electric furnace or the like can be employed for the heat treatment for repairing damage to the oxide semiconductor layer.

Realignment of atoms which exist in the oxide semiconductor layer or in the vicinity thereof is gradually carried out by the heat treatment. According to this, it is possible to repair dangling bonds formed by ultraviolet light irradiation in the oxide semiconductor layer, at the interface between the oxide semiconductor layer and the gate insulating layer, or at the interface between the oxide semiconductor layer and the insulating layer 420.

Damage to the oxide semiconductor layer by ultraviolet light can be repaired, so that a decrease in electric characteristics of the thin film transistor including the oxide semiconductor layer can be prevented and the shift of the threshold voltage in the negative direction can be suppressed.

In addition, even when the threshold voltage varies among thin film transistors formed over one substrate by ultraviolet light irradiation, the above-described heat treatment can reduce the variation in the threshold voltage.

The channel length of the thin film transistor is shortened, so that high speed operation and low power consumption of the electrophoretic display device can be achieved.

The heat treatment for repairing damage to the oxide semiconductor layer can also serve as heat treatment for curing the sealant 405 which is performed after ultraviolet light irradiation of the sealant 405.

As described above, the electrophoretic display device is manufactured by the method described in this embodiment, so that damage to an oxide semiconductor layer caused by ultraviolet light irradiation can be repaired. According to this, even when the oxide semiconductor layer of the thin film transistor included in the electrophoretic display device is damaged by ultraviolet light in the process for manufacturing the electrophoretic display device, shift of the threshold voltage of the thin film transistor in the negative direction due to the damage by ultraviolet light irradiation can be suppressed.

Moreover, the thin film transistor that functions as a switching element in the display device can be normally off, so that the electrophoretic display device having low power consumption and high reliability can be manufactured.

Embodiment 5

The electrophoretic display device described in Embodiment 4 can be used for electronic appliances of every field, which display information. For example, the electrophoretic display device (electronic paper) described in Embodiment 4 can be used for electronic book (e-book), posters, advertisement in vehicles such as trains, display in a variety of cards such as credit cards. Examples of such electronic appliances are illustrated in FIGS. 8A to 8C.

Figure 8A:
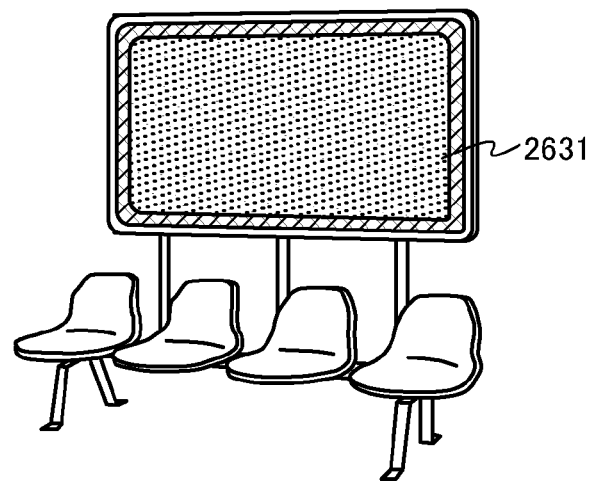
FIGS. 8A to 8C are each a view of an electronic appliance to which a display device according to one embodiment of the present invention is applied.

FIG. 8A illustrates a poster 2631 formed using electronic paper. When the advertizing medium is printed paper, the advertisement is replaced by manpower; however, when electronic paper is used, the advertisement display can be changed in a short time. Moreover, a stable image can be obtained without display deterioration. Further, the poster may send and receive information wirelessly.

When the electrophoretic display device described in Embodiment 4 is applied to the poster 2631, the thin film transistor that functions as a switching element can be normally off; thus, the poster 2631 having low power consumption and high reliability can be provided.

Figure 8B:
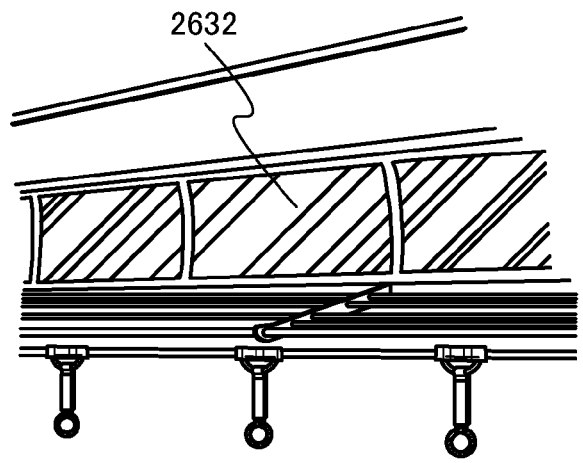
Figure 8C:
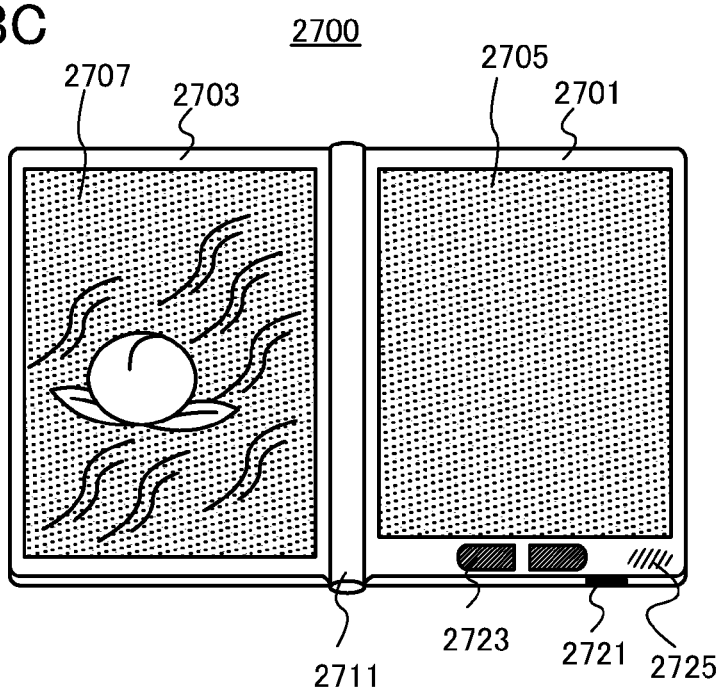

FIG. 8B illustrates an advertisement 2632 in a vehicle such as a train. When the advertizing medium is printed paper, the advertisement is replaced by manpower; however, when electronic paper is used, the advertisement display can be changed in a short time without much manpower. Moreover, a stable image can be obtained without display deterioration. Further, the advertisement in vehicles may send and receive information wirelessly.

When the electrophoretic display device described in Embodiment 4 is applied to the advertisement 2632 in a vehicle, the thin film transistor that functions as a switching element can be normally off; thus, the advertisement 2632 in a vehicle having low power consumption and high reliability can be provided.

FIG. 8C illustrates an example of an electronic book device. For example, an electronic book device 2700 includes two housings 2701 and 2703. The housings 2701 and 2703 are combined with a hinge 2711, along which the electronic book device 2700 is opened and closed. With such a structure, operation as a paper book is achieved.

A display portion 2705 is incorporated in the housing 2701 and a display portion 2707 is incorporated in the housing 2703. The display portion 2705 and the display portion 2707 may display one image or different images. In the structure where different images are displayed in different display portions, for example, the right display portion (the display portion 2705 in FIG. 8C) can display text and the left display portion (the display portion 2707 in FIG. 8C) can display images.

When the electrophoretic display device described in Embodiment 4 is applied to the display portions 2705 and 2707, the thin film transistor that functions as a switching element can be normally off; thus, the electronic book device 2700 having low power consumption and high reliability can be provided.

FIG. 8C illustrates an example in which the housing 2701 is provided with an operation portion and the like. For example, the housing 2701 is provided with a power supply 2721, an operation key 2723, a speaker 2725, and the like. The page can be turned with the operation key 2723. Note that a keyboard, a pointing device, and the like may be provided on the same plane as the display portion of the housing. Further, a rear surface or a side surface of the housing may be provided with an external connection terminal (an earphone terminal, a USB terminal, a terminal which can be connected with a variety of cables such as an AC adopter or a USB cable, and the like), a storage medium inserting portion, or the like. Moreover, the electronic book device 2700 may have a function of an electronic dictionary.

Further, the electronic book device 2700 may send and receive information wirelessly. Desired book data can be purchased and downloaded from an electronic book server wirelessly.

Embodiment 6

A display device disclosed in this specification can be applied to a variety of electronic appliances (including game machines). As the electronic appliances, there are, for example, a television device (also called TV or a television receiver), a monitor for a computer or the like, a digital camera, a digital video camera, a digital photo frame, a cellular phone (also called a mobile phone or a portable telephone device), a portable game machine, a portable information terminal, an audio playback device, and a large game machine such as a pachinko machine.

Figure 9A:
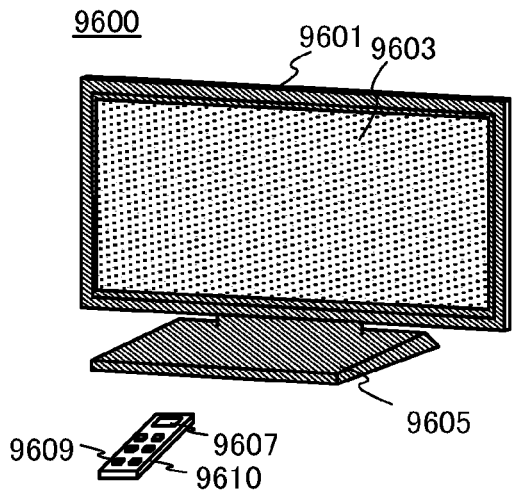
FIGS. 9A to 9F are each a view of an electronic appliance to which a display device according to one embodiment of the present invention is applied.

FIG. 9A illustrates an example of a television device. A display portion 9603 is incorporated in a housing 9601 of a television device 9600. The display portion 9603 can display images. Here, the housing 9601 is supported on a stand 9605.

The television device 9600 can be operated by an operation switch of the housing 9601 or a separate remote controller 9610. The channel and volume can be controlled with operation keys 9609 of the remote controller 9610 and the images displayed in the display portion 9603 can be controlled. Moreover, the remote controller 9610 may have a display portion 9607 in which the information outgoing from the remote controller 9610 is displayed.

When the electrophoretic display device described in any of Embodiments 1 to 4 is applied to the display portions 9603 and 9607, the thin film transistor that functions as a switching element can be normally off; thus, the television device 9600 having low power consumption and high reliability can be provided.

Note that the television device 9600 is provided with a receiver, a modem, and the like. With the use of the receiver, general television broadcasting can be received. Moreover, when the display device is connected to a communication network with or without wires via the modem, one-way (from a sender to a receiver) or two-way (between a sender and a receiver or between receivers) information communication can be performed.

Figure 9D:
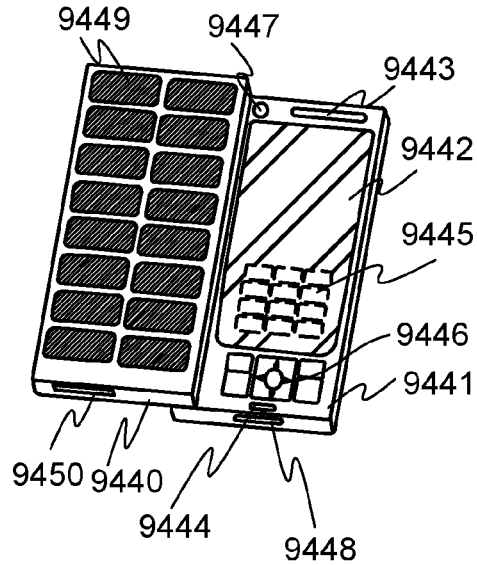
Figure 9B:
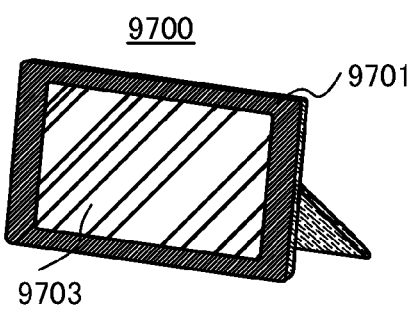

FIG. 9B illustrates an example of a digital photo frame. For example, a display portion 9703 is incorporated in a housing 9701 of a digital photo frame 9700. The display portion 9703 can display a variety of images, for example, displays image data taken with a digital camera or the like, so that the digital photo frame can function as a normal photo frame.

Note that the digital photo frame 9700 is provided with an operation portion, an external connection terminal (such as a USB terminal or a terminal which can be connected to a variety of cables including a USB cable), a storage medium inserting portion, and the like. These structures may be incorporated on the same plane as the display portion; however, they are preferably provided on the side surface or rear surface of the display portion because the design is improved. For example, a memory including image data taken with a digital camera is inserted into the storage medium inserting portion of the digital photo frame and the image data is imported. Then, the imported image data can be displayed in the display portion 9703.

When the electrophoretic display device described in any of Embodiments 1 to 4 is applied to the display portion 9703, the thin film transistor that functions as a switching element can be normally off; thus, the digital photo frame 9700 having low power consumption and high reliability can be provided.

The digital photo frame 9700 may send and receive information wirelessly. In this case, desired image data can be wirelessly imported into the digital photo frame 9700 and can be displayed therein.

Figure 9E:
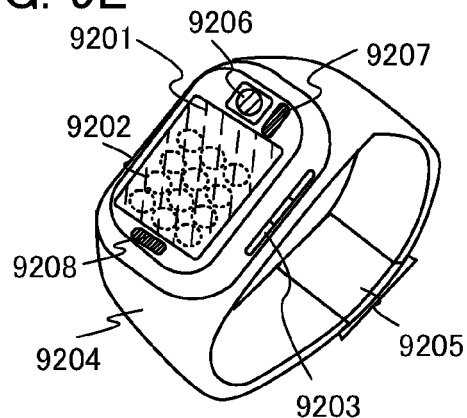
Figure 9C:
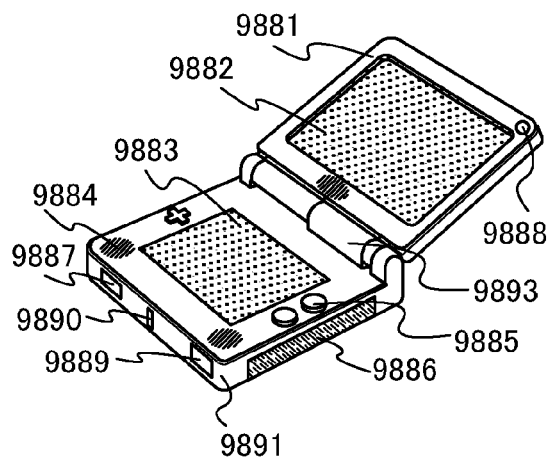

FIG. 9C illustrates a portable game machine including a housing 9881 and a housing 9891 which are jointed with a connector 9893 so as to be able to open and close. A display portion 9882 and a display portion 9883 are incorporated in the housing 9881 and the housing 9891, respectively. The portable game machine illustrated in FIG. 9C additionally includes a speaker portion 9884, a storage medium inserting portion 9886, an LED lamp 9890, an input means (operation keys 9885, a connection terminal 9887, a sensor 9888 (including a function of measuring force, displacement, position, speed, acceleration, angular speed, the number of rotations, distance, light, liquid, magnetism, temperature, chemical substance, sound, time, hardness, electric field, current, voltage, electric power, radiation, flow rate, humidity, tilt angle, vibration, smell, or infrared ray), a microphone 9889, and the like). Needless to say, the structure of the portable game machine is not limited to the above and other structures provided with at least a display device disclosed in this specification may be employed. Moreover, another accessory may be provided as appropriate. The portable game machine shown in FIG. 9C has a function of reading out a program or data stored in a storage medium to display it on the display portion, and a function of sharing information with another portable game machine by wireless communication. The portable game machine in FIG. 9C can have a variety of functions other than those above.

When the electrophoretic display device described in any of Embodiments 1 to 4 is applied to the display portions 9882 and 9883, the thin film transistor that functions as a switching element can be normally off; thus, the portable game machine having low power consumption and high reliability can be provided.

FIG. 9D illustrates a cellular phone including a housing 9440 and a housing 9441. The housings 9440 and 9441 in a state where they are developed as illustrated in FIG. 9D can overlap with each other by sliding. Thus, the size of the cellular phone can be reduced, which makes the cellular phone suitable for being carried. The housing 9441 is provided with a display panel 9442, a speaker 9443, a microphone 9444, a pointing device 9446, a camera lens 9447, an external connection terminal 9448, and the like. Further, the housing 9440 is provided with a solar cell 9449 which charges the cellular phone, an external memory slot 9450, and the like. In addition, an antenna is incorporated in the housing 9441.

When the electrophoretic display device described in any of Embodiments 1 to 4 is applied to the display panel 9442, the thin film transistor that functions as a switching element can be normally off; thus, the cellular phone having low power consumption and high reliability can be provided.

FIG. 9E is a perspective view of an example of a cellular phone that the user can wear on the wrist like a wristwatch.

This cellular phone is formed with a main body which includes a communication device including at least a telephone function, and a battery; a band portion which enables the main body to be worn on the wrist; an adjusting portion 9205 for adjusting the band portion to fit the wrist; a display portion 9201; a speaker 9207; and a microphone 9208.

In addition, the main body includes operation switches 9203. The operation switches 9203 can serve, for example, as a switch for starting a program for the Internet when pushed, in addition to serving as a power switch, a switch for switching displays, a switch for instruction to start taking images, or the like, and can be configured to have respective functions.

A user can input data into this cellular phone by touching the display portion 9201 with a finger or an input pen, operating the operation switches 9203, or inputting voice into the microphone 9208. In FIG. 9E, display buttons 9202 are displayed on the display portion 9201. A user can input data by touching the display buttons 9202 with a finger or the like.

Further, the main body includes a camera portion 9206 including an image pick-up means having a function of converting an image of an object, which is formed through a camera lens, to an electronic image signal. Note that the camera portion is not necessarily provided.

The cellular phone illustrated in FIG. 9E is provided with a receiver of a TV broadcast and the like, and can display an image on the display portion 9201 by receiving the TV broadcast. In addition, the cellular phone is provided with a memory device such as a memory, and the like, and can record the TV broadcast in the memory. The cellular phone illustrated in FIG. 9E may have a function of collecting location information such as GPS.

When the electrophoretic display device described in any of Embodiments 1 to 4 is applied to the display portion 9201, the thin film transistor that functions as a switching element can be normally off; thus, the cellular phone having low power consumption and high reliability can be provided.

Figure 9F:
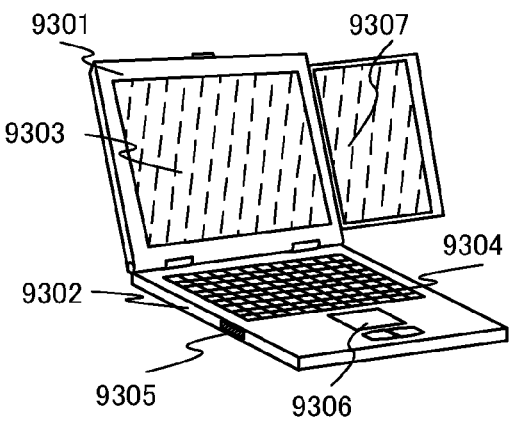

FIG. 9F is a perspective view illustrating an example of a portable computer.

In the portable computer illustrated in FIG. 9F, a top housing 9301 having a display portion 9303 and a bottom housing 9302 having a keyboard 9304 can overlap with each other by closing a hinge unit which connects the top housing 9301 and the bottom housing 9302. Thus, the portable computer is conveniently carried. Moreover, in the case of using the keyboard for input of data, the hinge unit is opened so that a user can input data looking at the display portion 9303.

The bottom housing 9302 includes a pointing device 9306 with which input can be performed, in addition to the keyboard 9304. When the display portion 9303 is a touch panel, a user can input data by touching part of the display portion. The bottom housing 9302 includes an arithmetic function portion such as a CPU or hard disk. In addition, the bottom housing 9302 includes an external connection port 9305 into which another device, for example, a communication cable conformable to communication standards of a USB is inserted.

The top housing 9301 further includes a display portion 9307 which can be stowed in the top housing 9301 by being slid therein. With the display portion 9307, a large display screen can be realized. In addition, the user can adjust the angle of a screen of the display portion 9307 that can be stored in the top housing 9301. If the display portion 9307 that can be stored in the top housing 9301 is a touch panel, the user can input data by touching part of the display portion 9307.

The display portion 9303 or the display portion 9307 that can be stored in the top housing 9301 is formed using an image display device such as a liquid crystal display panel or a light-emitting display panel using an organic light-emitting element, an inorganic light-emitting element, or the like.

When the electrophoretic display device described in any of Embodiments 1 to 4 is applied to the display portion 9303, and the display portion 9307 that can be stored in the top housing 9301, the thin film transistor that functions as a switching element can be normally off; thus, the portable computer having low power consumption and high reliability can be provided.

In addition, the portable computer illustrated in FIG. 9F can be provided with a receiver and the like and can receive a TV broadcast to display an image on the display portion. The user can watch a TV broadcast with the whole screen of the display portion 9307 by sliding and exposing the display portion 9307 and adjusting the angle thereof, with the hinge unit which connects the top housing 9301 and the bottom housing 9302 closed. In this case, the hinge unit is not opened and display is not performed on the display portion 9303. In addition, start up of only a circuit for displaying a TV broadcast is performed. Thus, power consumption can be minimized, which is useful for the portable computer whose battery capacity is limited.

Example 1

A so-called channel-etched thin film transistor was irradiated with ultraviolet light, and then heat treatment for repairing damage to an oxide semiconductor layer was performed. In this example, evaluation results of the threshold voltage of the transistor will be shown. The threshold voltage was measured at the following timings: after formation of the thin film transistor, and after the ultraviolet light irradiation, and after the heat treatment for repairing damage to the oxide semiconductor layer.

In this example, eight thin film transistors with a channel length L of 3 μm and a channel width W of 50 μm, eight thin film transistors with a channel length L of 4 μm and a channel width W of 50 μm, eight thin film transistors with a channel length L of 6 μm and a channel width W of 50 μm, eight thin film transistors with a channel length L of 10 μm and a channel width W of 50 μm, and eight thin film transistors with a channel length L of 20 μm and a channel width W of 50 μm were formed over one substrate. The dependence of the threshold voltage on the channel length was evaluated. First, a method for manufacturing the thin film transistors will be described.

First, as a base film, a stacked film of a 100-nm-thick silicon nitride film and a 150-nm-thick silicon oxynitride film was formed over a glass substrate by a CVD method. Over the silicon oxynitride film, a 100-nm-thick tungsten film was formed as a gate electrode layer by a sputtering method. Over the gate electrode layer, a 100-nm-thick silicon oxynitride film was formed as a gate insulating layer by a CVD method.

Next, a 30-nm-thick oxide semiconductor layer was formed using an In—Ga—Zn—O-based oxide semiconductor target ($In_2O_3:Ga_2O_3:ZnO=1:1:1$ [molar ratio]) under the following conditions: the distance between the substrate and the target was 60 mm, the pressure was 0.6 Pa, the direct current (DC) power supply was 0.5 kW, and an atmosphere of a chamber was an oxygen atmosphere. The oxide semiconductor layer was etched so that the channel length L of the thin film transistor was any of 3 μm, 4 μm, 6 μm, 10 μm, and 20 μm and the channel width W was 50 μm.

Then, heat treatment for dehydration or dehydrogenation was performed on the oxide semiconductor layer under a nitride atmosphere at 650° C. for 6 minutes, using a gas rapid thermal anneal (GRTA) apparatus.

As a source and drain electrode layers, a titanium film (100 nm in thickness), an aluminum film (200 nm in thickness), and a titanium film (100 nm in thickness) were stacked over the oxide semiconductor layer by a sputtering method.

Next, a silicon oxide film having a thickness of 300 nm was formed by a sputtering method so as to be in contact with the oxide semiconductor layer. An acrylic film having a thickness of 1.5 μm was formed over the silicon oxide film as an interlayer film.

Then, the oxide semiconductor layer was subjected to heat treatment under a nitrogen atmosphere at 250° C. for 1 hour. After that, as a wiring layer, a 110-nm-thick indium oxide-tin oxide alloy (ITSO) film containing silicon at 5 wt. % was formed over the acrylic film by a sputtering method.

Through the above steps, thin film transistors having a channel length L of 3 μm, 4 μm, 6 μm, 10 μm, and 20 μm and a channel width W of 50 μm were manufactured over one substrate.

Figure 10:
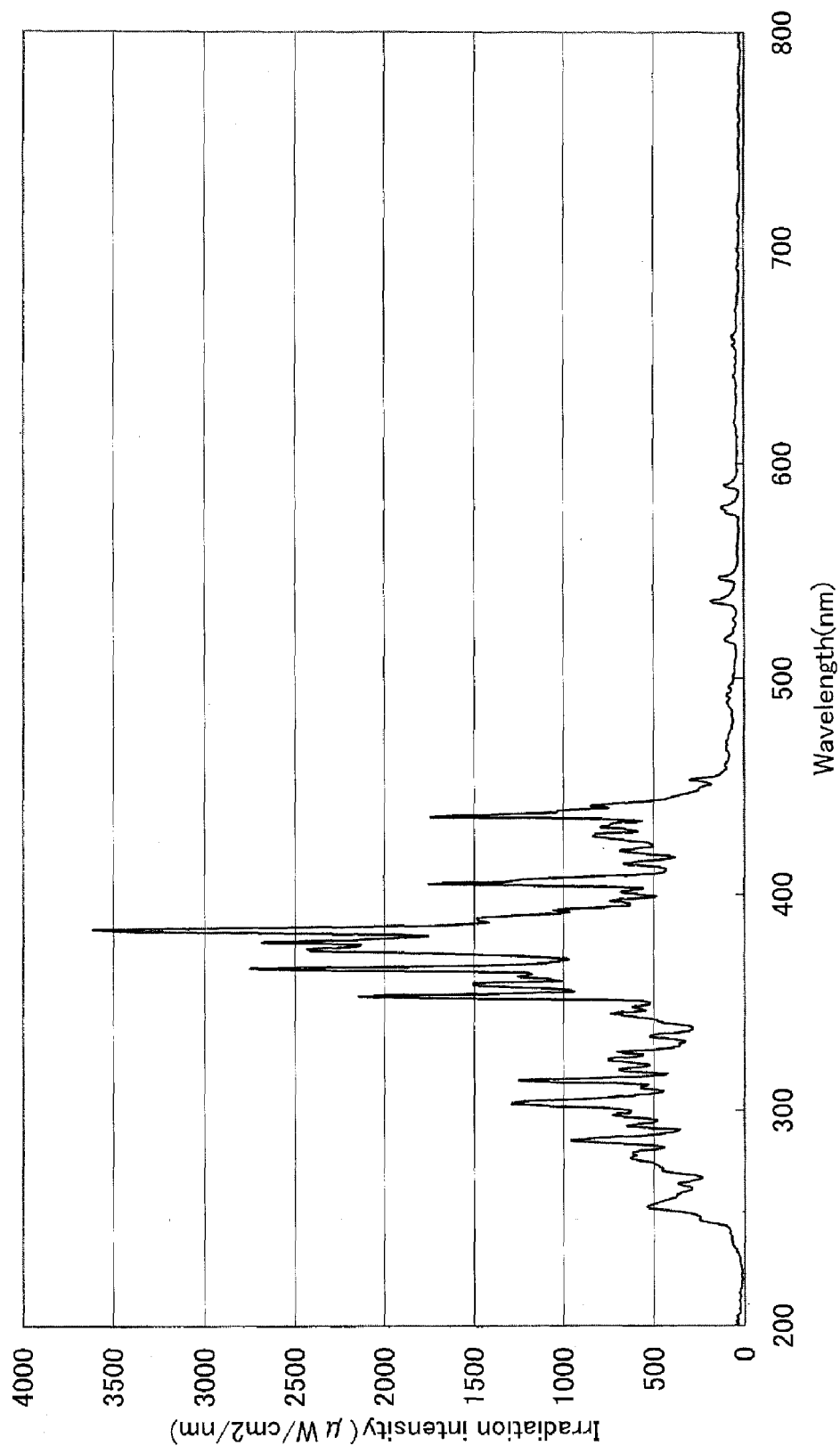
FIG. 10 is a graph showing a spectrum of ultraviolet light used in an example of the present invention.

Next, each of the transistors formed over one substrate is subjected to ultraviolet light irradiation. In this case, the irradiation intensity was 100 mW/cm$^2$ and the irradiation time was 3 minutes. The spectrum of the ultraviolet light is shown in FIG. 10. In FIG. 10, the vertical axis indicates the irradiation intensity (μW/cm$^2$/nm) and the horizontal axis indicates the wavelength (nm). As seen from FIG. 10, the wavelength of the ultraviolet light is approximately 250 nm to 450 nm.

Next, as heat treatment for repairing damage to the oxide semiconductor layer caused by ultraviolet light, heat treatment was continuously performed under an air atmosphere for a long time, at a lower temperature than the heat treatment for dehydration or dehydrogenation. Specifically, as the heat treatment for repairing damage to the oxide semiconductor layer, heat treatment was performed at 150° C. for 15 hours.

The threshold voltage of each of the thin film transistors was measured after formation of the thin film transistor, after the ultraviolet light irradiation, and after the heat treatment for repairing damage to the oxide semiconductor layer, and current-voltage characteristics of each of the thin film transistors was evaluated.

Figure 11:
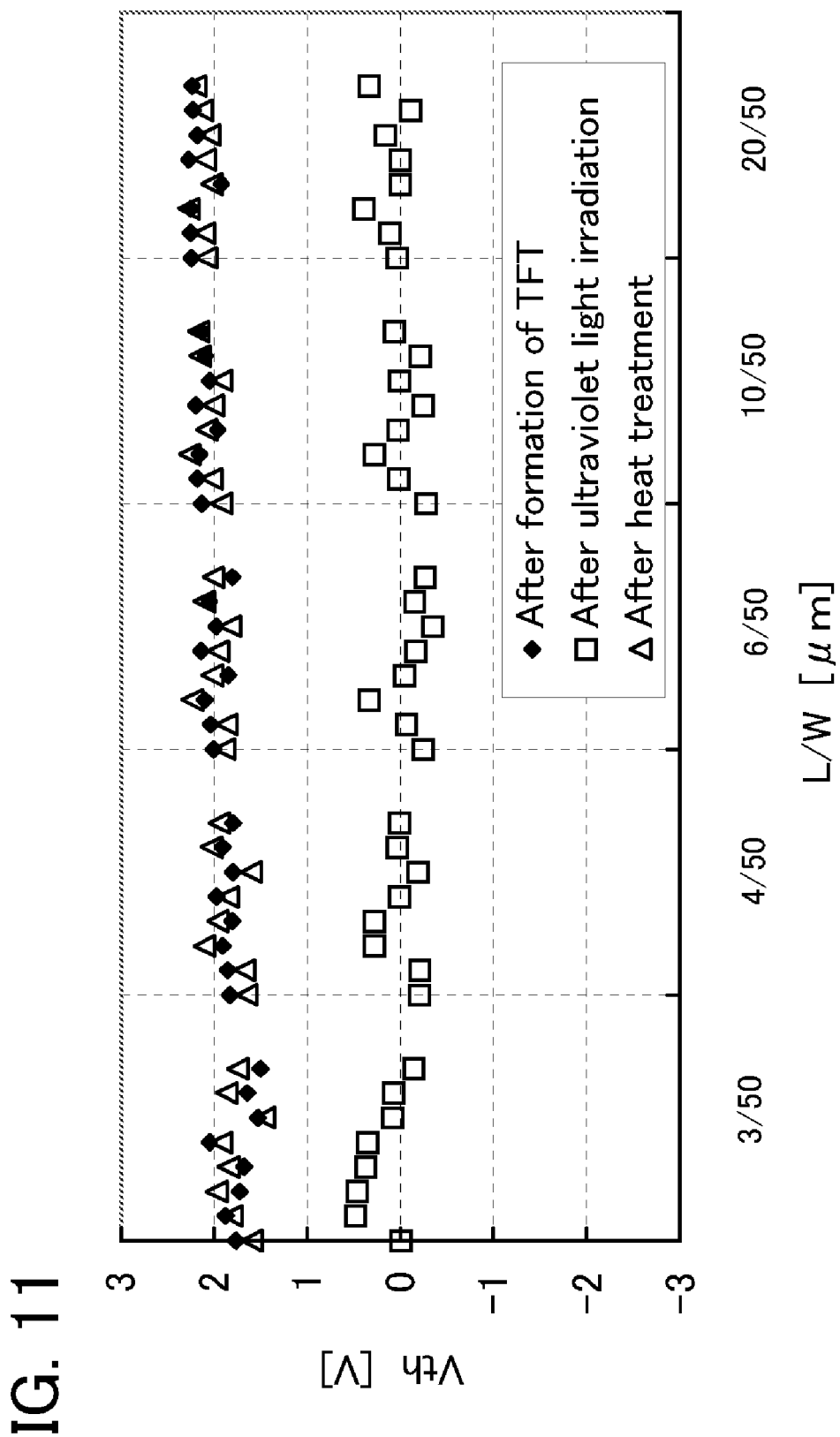
FIG. 11 is a graph showing the threshold voltage of each of thin film transistors in the example of the present invention.

In FIG. 11, the threshold voltage of each of the thin film transistors after formation of the thin film transistor, after the ultraviolet light irradiation, and after the heat treatment for repairing damage to the oxide semiconductor layer is shown. In FIG. 11, the vertical axis indicates the threshold voltage (Vth [V]) and the horizontal axis indicates the ratio of the channel length L to the channel width W (L [μm]/W [μm]).

The threshold voltage Vth is defined, in a graph where the horizontal axis and the vertical axis indicate the gate voltage (Vg [V]) and the square root of drain current ($Id^{1/2}$) respectively, as a point of intersection of the extrapolated tangent line of $Id^{1/2}$ having the highest inclination with the Vg axis.

As seen from FIG. 11, the threshold voltage is shifted in the negative direction by the ultraviolet light irradiation from the threshold voltage after the formation of the thin film transistor. The threshold voltage is improved to substantially the same as the threshold voltage after the formation of the thin film transistor by the heat treatment for repairing damage to the oxide semiconductor layer which is performed after the ultraviolet light irradiation. Tendency of the threshold voltage was observed without depending on the channel length of the thin film transistor.

Further, although variation in threshold voltage of each thin film transistor becomes considerable in some degree by the ultraviolet light irradiation, such variation is reduced by the heat treatment for repairing damage to the oxide semiconductor layer.

As described above, the heat treatment for repairing damage by ultraviolet light is performed after the ultraviolet light irradiation, damage to the oxide semiconductor layer can be repaired and the shift of the threshold voltage in the negative direction can be suppressed. According to this, even when the oxide semiconductor layer of the thin film transistor included in the display device is damaged by ultraviolet light in the process for manufacturing the display device, shift of the threshold voltage of the thin film transistor in the negative direction due to the damage by ultraviolet light irradiation can be suppressed.

This application is based on Japanese Patent Application serial no. 2009-296066 filed with Japan Patent Office on Dec. 25, 2009, the entire contents of which are hereby incorporated by reference.

The invention claimed is:

1. A method for manufacturing a display device, comprising the steps of:
   forming a pixel portion comprising a thin film transistor comprising an oxide semiconductor layer comprising a channel formation region over a first substrate;
   forming a sealant comprising an ultraviolet curable resin over the first substrate to surround at least the pixel portion;
   forming a liquid crystal layer comprising an ultraviolet curable resin to overlap the pixel portion by dropping a liquid crystal in a region surrounded by the sealant over the first substrate;
   attaching a second substrate to the first substrate with the sealant between the second substrate and the first substrate;
   irradiating the liquid crystal layer with ultraviolet light;
   curing the sealant with ultraviolet light irradiation after irradiating the liquid crystal layer with ultraviolet light; and
   performing heat treatment for repairing damage on the oxide semiconductor layer caused by the ultraviolet light irradiation from irradiating the liquid crystal layer with ultraviolet light and curing the sealant.

2. The method for manufacturing a display device according to claim 1, wherein the liquid crystal exhibits a blue phase.

3. The method for manufacturing a display device according to claim 1, further comprising irradiating the sealant with ultraviolet light to be temporarily cured before forming the liquid crystal layer.

4. The method for manufacturing a display device according to claim 1, wherein a pixel electrode electrically connected to the thin film transistor is subjected to surface treatment by ultraviolet light irradiation.

5. The method for manufacturing a display device according to claim 1, wherein the first substrate is divided along with the second substrate after curing the sealant.

6. The method for manufacturing a display device according to claim 1,
   wherein a second thin film transistor comprising an oxide semiconductor layer is formed in a driver circuit portion of the display device, and
   wherein the sealant overlaps with the driver circuit portion.

7. The method for manufacturing a display device according to of claim 1,
   wherein the heat treatment is performed for greater than or equal to 1 hour and less than or equal to 15 hours.

8. The method for manufacturing a display device according to claim 1,
   wherein the heat treatment is performed at greater than or equal to 125° C. and less than or equal to 250° C.

9. A method for manufacturing a display device, comprising the steps of:
   forming a pixel portion comprising a thin film transistor comprising an oxide semiconductor layer comprising a channel formation region over a first substrate;
   forming a sealant comprising an ultraviolet curable resin over a second substrate to surround at least the pixel portion;
   forming a liquid crystal layer comprising an ultraviolet curable resin by dropping a liquid crystal in a region surrounded by the sealant over the second substrate;
   attaching the first substrate to the second substrate with the sealant between the first substrate and the second substrate so that the pixel portion overlaps with the liquid crystal layer;
   irradiating the liquid crystal layer with ultraviolet light;
   curing the sealant with ultraviolet light irradiation after irradiating the liquid crystal layer with ultraviolet light; and
   performing heat treatment for repairing damage on the oxide semiconductor layer caused by the ultraviolet light irradiation from irradiating the liquid crystal layer with ultraviolet light and curing the sealant.

10. The method for manufacturing a display device according to claim 9, wherein the liquid crystal exhibits a blue phase.

11. The method for manufacturing a display device according to claim 9, further comprising irradiating the sealant with ultraviolet light to be temporarily cured before forming the liquid crystal layer.

12. The method for manufacturing a display device according to claim 9, wherein a pixel electrode electrically connected to the thin film transistor is subjected to surface treatment by ultraviolet light irradiation.

13. The method for manufacturing a display device according to claim 9, wherein the first substrate is divided along with the second substrate after curing the sealant.

14. The method for manufacturing a display device according to claim 9,
   wherein a second thin film transistor comprising an oxide semiconductor layer is formed in a driver circuit portion of the display device, and
   wherein the sealant overlaps with the driver circuit portion.

15. The method for manufacturing a display device according to of claim 9,
   wherein the heat treatment is performed for greater than or equal to 1 hour and less than or equal to 15 hours.

16. The method for manufacturing a display device according to claim 9,
   wherein the heat treatment is performed at greater than or equal to 125° C. and less than or equal to 250° C.

17. A method for manufacturing a display device, comprising the steps of:
- forming a pixel portion comprising a thin film transistor comprising an oxide semiconductor layer comprising a channel formation region over a first substrate;
- forming a sealant comprising an ultraviolet curable resin over the first substrate to surround at least the pixel portion;
- forming a liquid crystal layer comprising an ultraviolet curable resin to overlap the pixel portion by dropping a liquid crystal in a region surrounded by the sealant over the first substrate;
- attaching a second substrate to the first substrate with the sealant between the second substrate and the first substrate;
- irradiating the liquid crystal layer with ultraviolet light;
- curing the sealant with ultraviolet light irradiation after irradiating the liquid crystal layer with ultraviolet light; and
- performing heat treatment on the oxide semiconductor layer at greater than or equal to 125° C. and less than or equal to 250° C. after curing the sealant with ultraviolet light irradiation.

18. The method for manufacturing a display device according to claim 17, wherein the liquid crystal exhibits a blue phase.

19. The method for manufacturing a display device according to claim 17, further comprising irradiating the sealant with ultraviolet light to be temporarily cured before forming the liquid crystal layer.

20. The method for manufacturing a display device according to claim 17, wherein a pixel electrode electrically connected to the thin film transistor is subjected to surface treatment by ultraviolet light irradiation.

21. The method for manufacturing a display device according to claim 17, wherein the first substrate is divided along with the second substrate after curing the sealant.

22. The method for manufacturing a display device according to claim 17,
- wherein a second thin film transistor comprising an oxide semiconductor layer is formed in a driver circuit portion of the display device, and
- wherein the sealant overlaps with the driver circuit portion.

23. The method for manufacturing a display device according to claim 17,
- wherein the heat treatment is performed for greater than or equal to 1 hour and less than or equal to 15 hours.

24. A method for manufacturing a display device, comprising the steps of:
- forming a pixel portion comprising a thin film transistor comprising an oxide semiconductor layer comprising a channel formation region over a first substrate;
- forming a sealant comprising an ultraviolet curable resin over a second substrate to surround at least the pixel portion;
- forming a liquid crystal layer comprising an ultraviolet curable resin by dropping a liquid crystal in a region surrounded by the sealant over the second substrate;
- attaching the first substrate to the second substrate with the sealant between the first substrate and the second substrate so that the pixel portion overlaps with the liquid crystal layer;
- irradiating the liquid crystal layer with ultraviolet light;
- curing the sealant with ultraviolet light irradiation after irradiating the liquid crystal layer with ultraviolet light; and
- performing heat treatment on the oxide semiconductor layer at greater than or equal to 125° C. and less than or equal to 250° C. after curing the sealant with ultraviolet light irradiation.

25. The method for manufacturing a display device according to claim 24, wherein the liquid crystal exhibits a blue phase.

26. The method for manufacturing a display device according to claim 24, further comprising irradiating the sealant with ultraviolet light to be temporarily cured before forming the liquid crystal layer.

27. The method for manufacturing a display device according to claim 24, wherein a pixel electrode electrically connected to the thin film transistor is subjected to surface treatment by ultraviolet light irradiation.

28. The method for manufacturing a display device according to claim 24, wherein the first substrate is divided along with the second substrate after curing the sealant.

29. The method for manufacturing a display device according to claim 24,
- wherein a second thin film transistor comprising an oxide semiconductor layer is formed in a driver circuit portion of the display device, and
- wherein the sealant overlaps with the driver circuit portion.

30. The method for manufacturing a display device according to claim 24,
- wherein the heat treatment is performed for greater than or equal to 1 hour and less than or equal to 15 hours.

* * * * *